United States Patent
Toida

(10) Patent No.: US 7,365,285 B2
(45) Date of Patent: Apr. 29, 2008

(54) LASER ANNEALING METHOD AND APPARATUS

(75) Inventor: Masahiro Toida, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 155 days.

(21) Appl. No.: 10/852,155

(22) Filed: May 25, 2004

(65) Prior Publication Data

US 2004/0241922 A1 Dec. 2, 2004

(30) Foreign Application Priority Data

May 26, 2003 (JP) ............................. 2003-147968

(51) Int. Cl.
*B23K 26/06* (2006.01)

(52) U.S. Cl. .................. 219/121.65; 438/166; 438/795

(58) Field of Classification Search ................ 438/166, 438/438, 795; 219/121.67, 121.77, 121.65, 219/121.74, 121.66
See application file for complete search history.

(56) References Cited

U.S. PATENT DOCUMENTS

| | | | | |
|---|---|---|---|---|
| 4,480,168 | A * | 10/1984 | Cielo et al. ............ | 219/121.74 |
| 5,173,583 | A * | 12/1992 | de Contencin et al. | 219/121.74 |
| 6,437,284 | B1 * | 8/2002 | Okamoto et al. ........... | 438/487 |
| 6,780,692 | B2 * | 8/2004 | Tatsuki et al. .............. | 438/166 |
| 7,098,155 | B2 * | 8/2006 | Talwar et al. ............... | 438/795 |
| 2002/0004292 | A1 * | 1/2002 | Yamazaki et al. .......... | 438/487 |
| 2002/0008091 | A1 * | 1/2002 | Brandinger et al. ... | 219/121.67 |
| 2002/0132402 | A1 * | 9/2002 | Tanaka et al. .............. | 438/166 |
| 2003/0153182 | A1 * | 8/2003 | Yamazaki et al. .......... | 438/689 |
| 2003/0226834 | A1 * | 12/2003 | Ishikawa et al. ....... | 219/121.77 |
| 2004/0188396 | A1 * | 9/2004 | Talwar et al. .......... | 219/121.65 |

FOREIGN PATENT DOCUMENTS

| | | | |
|---|---|---|---|
| JP | 60-216986 A | * | 10/1985 |
| JP | 2001-144027 A | | 5/2001 |
| JP | 2002-305208 A | * | 10/2002 |

OTHER PUBLICATIONS

N. Sasaki et al., "A New Low-Temperature Poly-Si TFT Technology Realizing Mobility above 500 $cm^2$/Vs by Using CW Laser Lateral Crystallization (CLC)", IEICE Journal, vol. J85-C, No. 8, pp. 601-608, Aug. 2002.

M. Matsumura, "Preparation of Ultra-Large Grain Silicon Thin-Films by Excimer-Laser", Surface Science, vol. 21, No. 5, pp. 278-287, (2000).

* cited by examiner

*Primary Examiner*—Geoffrey S. Evans
(74) *Attorney, Agent, or Firm*—Sughrue Mion, PLLC

(57) ABSTRACT

A laser annealing system and apparatus, which includes a laser light source, which emits a laser beam through an a-Si layer on a substrate, an optical unit which forms an optical path along which the laser beam is transmitted through a subject to be annealed, and a first reflecting component, which reflects the laser beam that has been transmitted through the subject so that a direction of the laser beam is reversed along the optical path along which the laser beam is transmitted through the subject, to irradiate the subject. Since an operation in which energy is absorbed is repeated plural times when the laser beam is transmitted through the a-Si layer, input energy of the laser beam can be utilized without waste.

24 Claims, 34 Drawing Sheets

F I G. 2
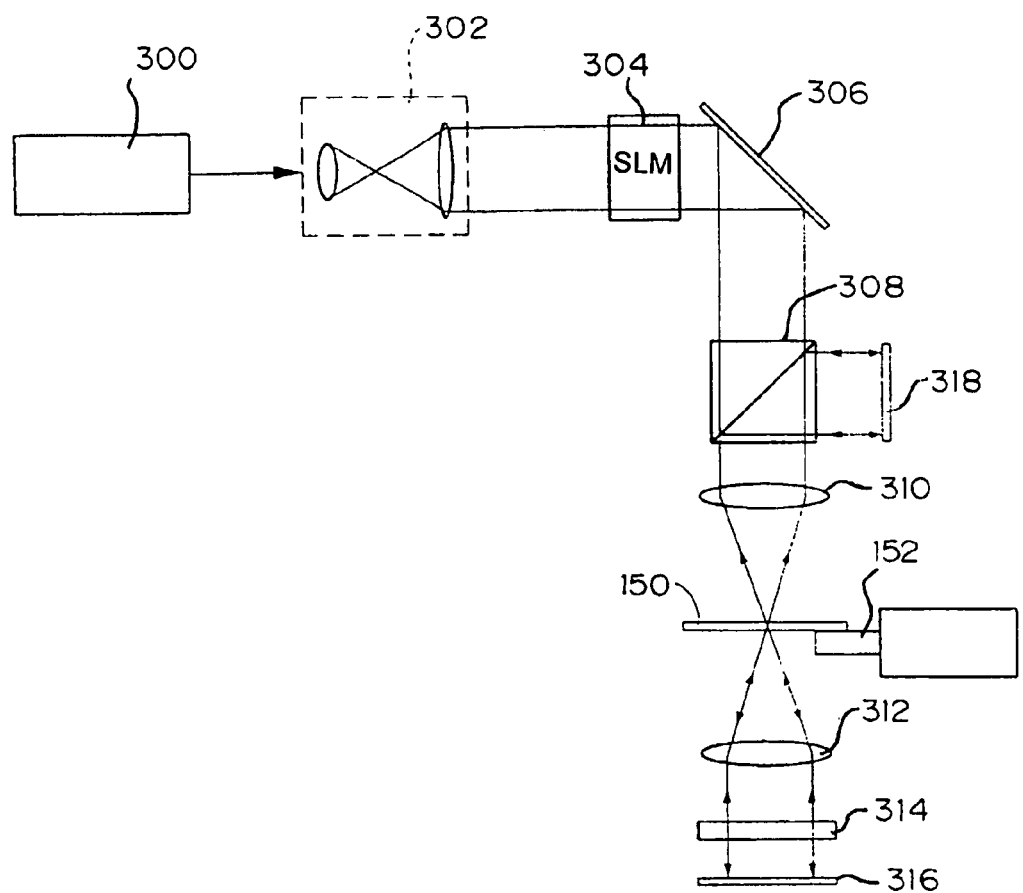

F I G. 1 4 A
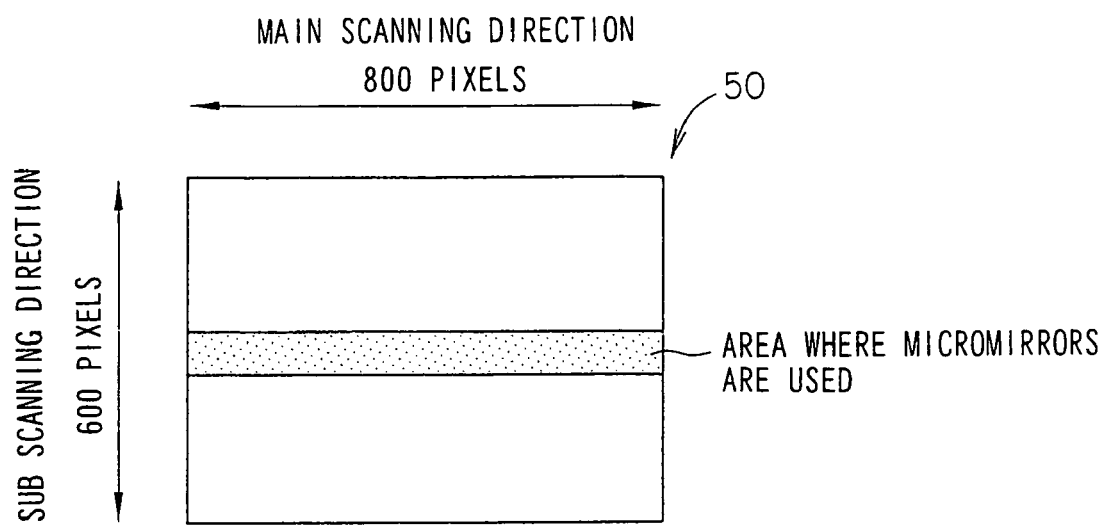
F I G. 1 4 B
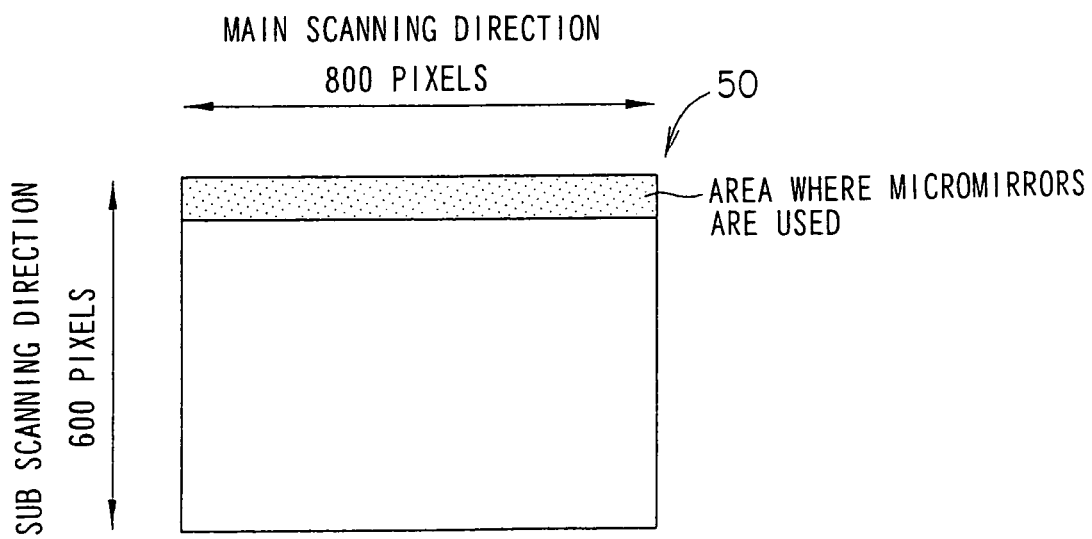

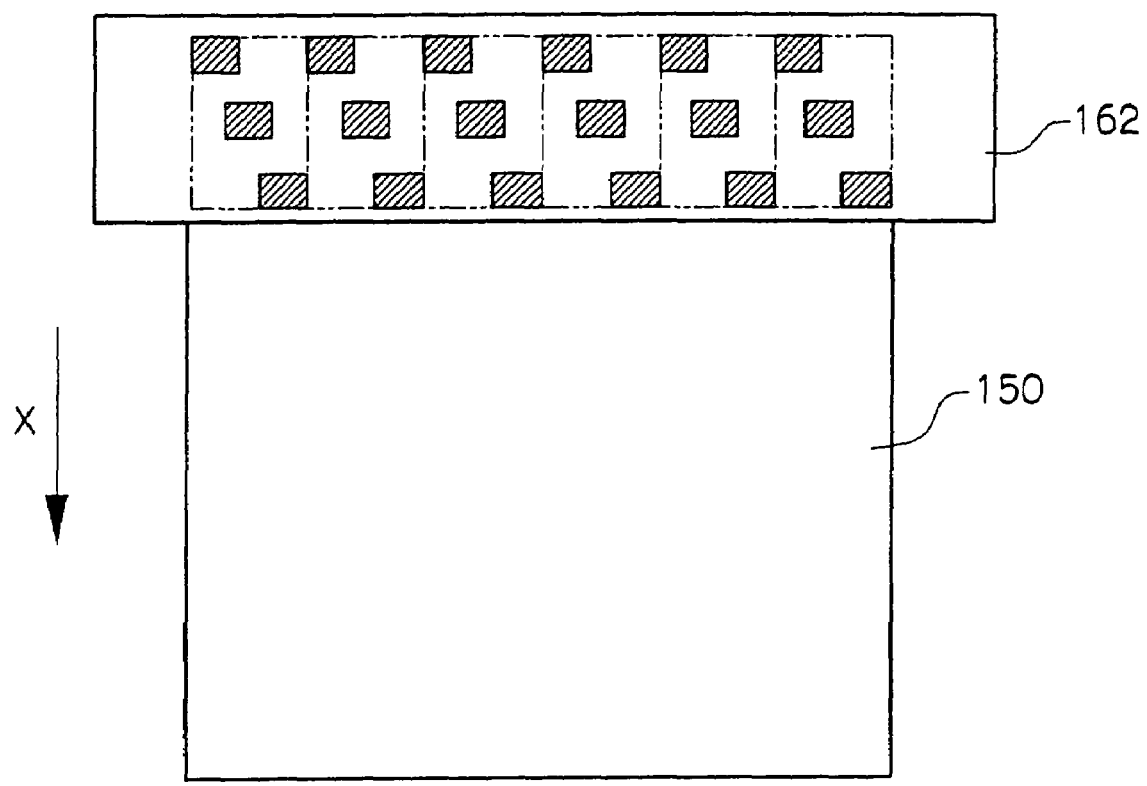
F I G. 15

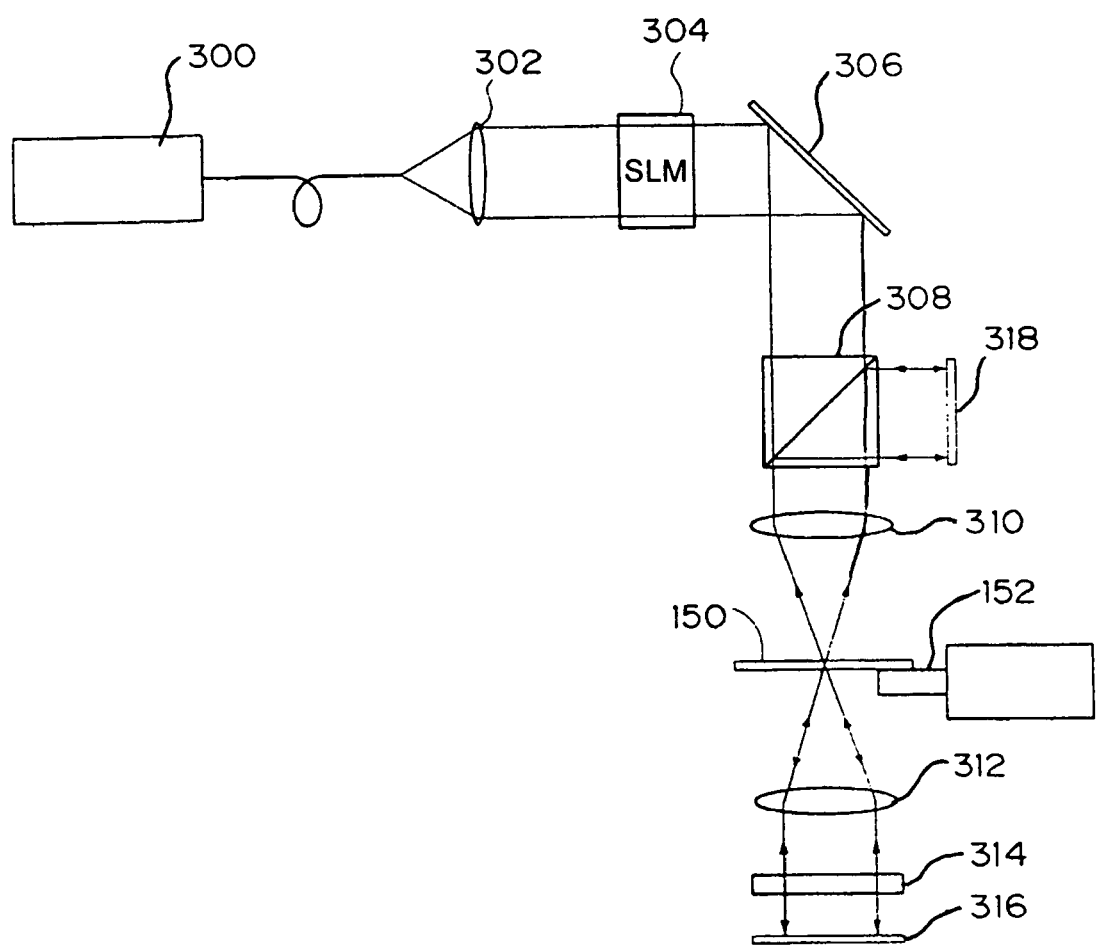
F I G. 2 1

F I G. 2 7
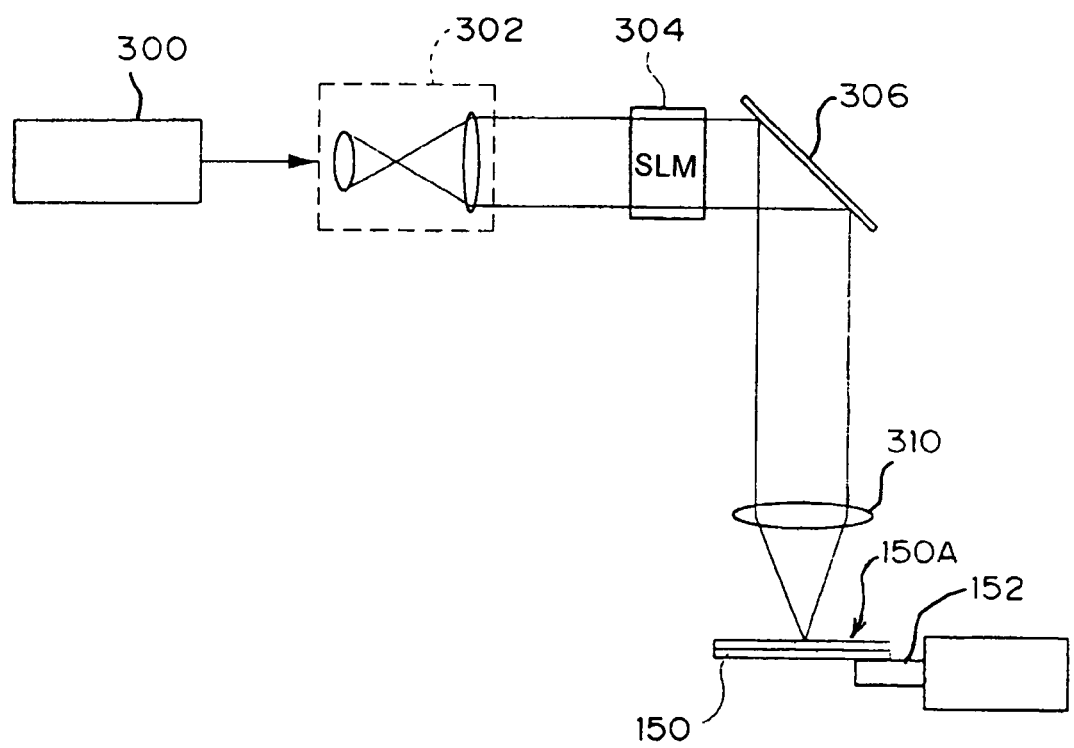

US 7,365,285 B2

LASER ANNEALING METHOD AND APPARATUS

CROSS-REFERENCE TO RELATED APPLICATION

This application claims priority under 35 USC 119 from Japanese Patent Application No. 2003-147968, the disclosure of which is incorporated by reference herein.

BACKGROUND OF THE INVENTION

1. Field of the Invention

The present invention relates to a laser annealing method and a laser annealing apparatus, which perform an annealing process in such a manner that a laser beam is transmitted through a subject plural times by reversing a direction of the laser beam to irradiate the subject.

2. Description of the Related Art

System On Glass (SOG)-TFT generally receives attention, in which a driving circuit, a signal processing circuit, and an image processing circuit are directly formed on a glass substrate of LCD, as well as a thin film transistor (TFT) for pixel display gate. That is noted from viewpoint of reduction in size and weight, and cost saving of flat-panel displays such as a liquid crystal display (LCD) and an organic electro-luminescence (EL) display.

Although amorphous silicon (a-Si) is used for TFT for pixel display gate, polysilicon (poly-Si) having large carrier mobility is required for SOG-TFT. However, since deformation temperature of the glass is as low as 600° C., in formation of a poly-Si film, it is impossible to use a crystal growth technology utilizing a high temperature more than 600° C. Therefore, excimer laser anneal (ELA) is used for the formation of the poly-Si film. In the excimer laser anneal, after an a-Si film is formed at lower temperature (100° C. to 300° C.), pulse irradiation of a XeCl excimer laser having a wavelength of 308 nm is performed to thermally fuse the a-Si film, and the a-Si film is crystallized in a cooling process. The poly-Si film can be formed without thermally damaging the glass substrate by the use of ELA.

The conventional laser annealing process in which a-Si is changed into poly-Si is performed by irradiating the a-Si film only from one side with the XeCl excimer laser having a wavelength of 308 nm. Since an absorption coefficient of the XeCl excimer laser having a wavelength of 308 nm to the a-Si is as large as $1 \times 10^6$ cm$^{-1}$, input energy is absorbed in a region which is extremely close to a surface (<1 nm).

Therefore, when the excimer laser anneal is used, a large temperature gradient is generated in a depth direction in the Si layer fused by the absorption of laser energy and heat transfer, and sometimes the Si layer becomes a partially-fused state shown in FIG. 29.

In this case, heat is diffused mainly in a substrate direction and solid-state phase transition into a crystal phase occurs at 800° C. in the remaining a-Si which has not been fused, so that a crystal nucleus is generated in a boundary portion between the fused Si phase and the a-Si phase. With the generated crystal nucleus being a starting point, crystal grows in an upward direction of FIG. 29 along the temperature gradient. A crystal grain which has grown from the crystal nucleus collides with another crystal grain which has grown from an adjacent crystal nucleus, and the crystal growth is stopped at the state in which the crystal grain is small and there are many crystal grain boundaries.

High electric charge mobility is required for high performance of TFT. Since the crystal grain boundary becomes obstacle of the movement for electron, in order to increase electric charge mobility, it is important to generate a crystal grain having few crystal grain boundaries, that is, a large crystal grain.

Therefore, as shown in FIG. 30, in the excimer laser anneal, when output of the excimer laser is increased and the remaining a-Si phases are formed in the shape of an island, the number of crystal nucleuses generated is decreased and each crystal grain is grown in a large size.

As shown in FIG. 31, in the excimer laser anneal, when the output of the excimer laser is further increased and the a-Si phases are completely fused, the Si layer becomes a supercooling state in which the crystallization is not started even if the temperature is decreased below a melting point. Then, when the temperature is further decreased, crystal nucleuses are generated all at once to fill the Si layer with minute crystal grains.

FIG. 32 quantitatively shows a relationship between the laser intensity and the diameter of the crystal grain described above. As the laser intensity is increased, the diameter of the crystal grain is increased such that the a-Si layer changes from a partially fused (a) state to the fused state (b) in which the remaining a-Si phases are formed in the island shape. Once the laser intensity exceeds the intensity at which a-Si is completely fused, the Si layer becomes fully fused state (c), and the diameter of the crystal grain is remarkably decreased. Output stability of the excimer laser is not good, and usually a fluctuation in intensity in a range of 10 to 15% is unavoidable (hatching in FIG. 32). Therefore, an effective diameter of the crystal grain obtained by the excimer laser is currently about 0.3 µm at most. This is also the limitation by setting a crystal growth direction to a vertical direction (vertical direction in FIGS. 29 and 30).

In consideration of the above problem, there has been devised an annealing method which controls the crystal growth in lateral direction in such a manner that a laser beam is slowly scanned on a substrate so as not to completely fuse the a-Si and not to create the supercooling state.

In the annealing method, as shown in FIG. 33, although the crystal nucleus is generated in the a-Si layer which is not irradiated with the laser beam, the crystal growth proceeds from the crystal nucleus in a bottom portion of the boundary between the a-Si and the fused layer to an obliquely upward direction due to a temperature gradient. It is considered that, since the temperature gradient is present in the depth direction, a solid-liquid interface is inclined and the crystal growth proceeds perpendicular to the oblique solid-liquid interface.

The size of the crystal grain is restricted by a film thickness and the collision with other crystal grains from other directions. The essential cause thereof is the large temperature gradient in the depth direction of the fused layer.

In consideration of the problem of the crystal growth in the lateral direction in the excimer laser, there has been devised a laser anneal which uses a light beam having a wavelength of 532 nm of a high-output Nd:YVO$_4$ laser in which a laser output stability is high (as 1%).

Since the absorption coefficient of the light beam having a wavelength of 532 nm of the Nd:YVO$_4$ laser with respect to a-Si is $5 \times 10^4$ cm$^{-1}$, a film thickness of 460 nm is required to absorb 90% of the input energy. The absorption coefficient of the light beam having a wavelength of 532 nm of the Nd:YVO$_4$ laser is smaller than that of the light beam having a wavelength of 308 nm of the excimer laser by 1.5 digits. As shown if FIG. 34, when the laser beams are compared to each other with the same film thickness, the temperature gradient in the depth direction becomes more flat and the solid-liquid interface is likely to be vertical in the case of the light beam having a wavelength of 532 nm. Therefore, a growth distance in the lateral direction can be longer, and a large crystal grain is generated.

In consideration of the problem of the crystal growth in the lateral direction in the excimer laser, there is disclosed a laser annealing method in which a sample having a four-layer structure of a-Si/SiO$_2$ insulating thin film/Cr light absorber thin film/substrate is irradiated from both sides with the laser beam (308 nm) of the excimer laser. In this method, a heat bath under the SiO$_2$ layer is generated by absorbing the laser energy from a backside in the Cr light absorber thin film. As a result, the heat of the Si layer generated by the laser energy from the front surface side is hardly transferred to the substrate direction. As transfer velocity of thermal energy accumulated in the Si layer is decreased, the heat is transferred in the direction of the Si film surface, and the crystal growth in the lateral direction is controlled (for example, see Surface Science vol. 21, No. 5, pp. 278 to 287 (2000)).

Further, there is disclosed a laser annealing apparatus of the both-side irradiation by a solid-state laser, in which a second harmonic wave (532 nm), a third harmonic wave (355 nm), and a fourth harmonic wave (266 nm) of a Nd:YAG laser are utilized.

In the above both-side irradiation laser annealing apparatus, the individual laser beam passes through the Si layer one time from the front surface and the backside surface. That is to say, the annealing process is performed in such a manner that one position of Si film is irradiated with the laser beam from the backside surface, while the same position of Si film is irradiated with the laser beam from the front surface side (see, for example, Japanese Patent Application Laid-Open (JP-A) No. 2001-144027).

In the above laser annealing method, which utilizes the XeCl excimer laser, the output of the light beam is not stable, and output intensity fluctuates in the range within ±10%. In ELA, the diameter sizes of the crystal grains are varied in the poly-Si film and reproducibility is poor. In the XeCl excimer laser, a repeat frequency of pulse drive is as low as 300 Hz. In ELA, therefore, it is difficult to form a continuous crystal grain boundary, high-carrier mobility is not obtained, and annealing a large area of the Si film at high speed can not be realized. Further, in the XeCl excimer laser, there is intrinsic problems that maintenance cost is high due to short lives of a laser tube and laser gas as low as about $1 \times 10^7$ shots, the apparatus is enlarged, and energy efficiency is as low as 3%.

In order to improve performance of TFT, it is also important to thin the crystal film (not more than 50 nm) in addition to the increase in the diameter of the crystal grain.

In the laser annealing method which utilizes the light beam having a wavelength of 532 nm of the Nd:YVO$_4$ laser, a solid-liquid interface can become vertical, which is effective to the formation of a large crystal grain. However, since the absorption coefficient of the light beam having a wavelength of 532 nm of the Nd:YVO$_4$ laser with respect to a-Si is small, although the solid-liquid interface is vertical, the film thickness not lower than 150 nm is required in order to secure the energy absorption necessary to fuse the a-Si film.

Therefore, in the laser annealing method, the vertical formation of the solid-liquid interface effective to the formation of a large crystal grain is contradictory to the thinning of the crystal film. Optical properties of a-Si cause the contradiction, and it is difficult to balance these contradictory demands with each other.

Further, in the laser annealing method which utilizes the light beam having a wavelength of 532 nm of the Nd:YVO$_4$ laser, since the film thickness of 460 nm is required to absorb 90% of the input energy, waste of the input energy tends to increase when the a-Si film is thinned.

SUMMARY OF THE INVENTION

In view of the foregoing, the present invention is to provide a laser annealing method and apparatus, which can form a large crystal grain by utilizing laser energy without waste and can realize thin film crystallization.

In a laser annealing method of a first aspect of the present invention, an energy absorption distribution generated in a direction in which a laser beam is transmitted through a subject to be annealed is held constant, in such a manner that the laser beam emitted from a laser light source is caused to be transmitted through the subject to be annealed plural times by reversing a direction of the laser beam along an optical path to irradiate the subject to be annealed.

That is to say, in the laser annealing method of the aspect, the laser beam is emitted from the laser light source, the laser beam is transmitted through the subject to be annealed, and a direction of the laser beam is reversed along the optical path to irradiate the subject to be annealed. As a result, the laser beam is transmitted through the subject plural times, and the energy absorption distribution generated in the direction in which the laser beam is transmitted through the subject to be annealed is held constant.

According to the above laser annealing method, since operation in which energy is absorbed is repeated plural times when the laser beam is transmitted through the subject, input energy of the laser beam can be utilized without waste of the input energy. Further, since a direction of the laser beam is reversed along one optical path to irradiate the subject, an energy absorption distribution generated in a thickness direction of the subject to be annealed is made constant to cause a solid-liquid interface to be flat along the optical path. Therefore, crystal growth in a lateral direction can be realized to form a large crystal grain.

A laser annealing apparatus of a second aspect of the invention includes a laser light source which emits a laser beam, an optical path which causes the laser beam to be transmitted through a subject to be annealed, a polarization beam splitter which is arranged on the optical path between the laser light source and the subject and transmits the laser beam emitted from the laser light source, a first mirror which reflects the laser beam transmitted through the subject so that a direction of the laser beam is reversed along the optical path along which the laser beam is transmitted through the subject, to irradiate the subject, a quarter-wave plate which is arranged on the optical path between the subject and the mirror, and a second mirror which reflects the laser beam in which polarized incident light which is of the laser beam transmitted through the subject passes through the quarter-wave plate, is reflected by the first mirror, passes through the quarter-wave plate again to become polarized light orthogonal to the incident polarized light, and is transmitted through the subject again to be reflected by the polarization beam splitter so that a direction of the laser beam is reversed along the optical path along which the laser beam is transmitted through the subject.

According to the above configuration, the laser beam emitted from the laser light source is transmitted through the subject at a first time, passes through the quarter-wave plate, is reflected by the mirror, and passes through the quarter-wave plate again to become the polarized light orthogonal to the polarized incident light. Then, the laser beam is transmitted through the subject at a second time, reflected by the polarization beam splitter, and reflected by the mirror, and a direction of the laser beam is reversed along the optical path along which the laser beam is transmitted through the subject. Then, the laser beam is transmitted through the subject at a third time, passes through the quarter-wave plate, is reflected by the mirror, passes through the quarter-wave plate again to become the polarized light which is the same as the polarized incident light, and is transmitted through the subject at a fourth time.

Thus, since the operation in which the energy is absorbed is repeated four times when the laser beam is transmitted through the subject, the input energy of the laser beam can be utilized without waste of the input energy. Further, since a direction of the laser beam is reversed along one optical path to irradiate the subject, the energy absorption distribution generated in the thickness direction of the subject to be annealed is made constant to cause the solid-liquid interface to be flat along the optical path. Therefore, crystal growth in the lateral direction can be realized to form a large crystal grain.

A laser annealing apparatus of a third aspect of the invention is intended for a annealing process of a subject including a film to be annealed, a reflecting film which reflects the laser beam transmitted through the film to be annealed so that a direction of the laser beam is reversed along an optical path along which the laser beam is transmitted through the film to be annealed, and a buffer layer which is arranged between the film to be annealed and the reflecting film and has a function of a quarter-wave plate. The laser annealing apparatus of the third aspect of the invention includes a laser light source which emits a laser beam, an optical path along which the laser beam is transmitted through a film to be annealed provided in a subject, a polarization beam splitter which is arranged on the optical path between the laser light source and the subject and transmits the laser beam emitted from the laser light source, and a mirror which reflects the laser beam in which polarized incident light which is of the laser beam transmitted through the film annealed passes through a buffer layer having a function of a quarter-wave plate, is reflected by the reflecting film, passes through the buffer layer having the function of the quarter-wave plate again to become polarized light orthogonal to the polarized incident light, and is transmitted through the film annealed again to be reflected by the polarization beam splitter so that a direction of the laser beam is reversed along the optical path along which the laser beam is transmitted through the subject.

According to the above configuration, the laser beam emitted from the laser light source is transmitted through the subject at a first time, passes through the buffer layer having the function of the quarter-wave plate, is reflected by the reflecting film, and passes through the buffer layer having the function of the quarter-wave plate again to become the polarized light orthogonal to the polarized incident light. Then, the laser beam is transmitted through the subject at a second time, reflected by the polarization beam splitter, and reflected by the mirror, and a direction of the laser beam is reversed the optical path along which the laser beam is transmitted through the subject. Then, the laser beam is transmitted through the subject at a third time, passes through the buffer layer having the function of the quarter-wave plate, is reflected by the reflecting film, passes through the buffer layer having the function of the quarter-wave plate again to become the polarized light which is the same as the polarized incident light, and is transmitted through the subject at a fourth time.

Thus, since the operation in which the energy is absorbed is repeated four times when the laser beam is transmitted through the subject, the input energy of the laser beam can be utilized without waste of the input energy. Further, since a direction of the laser beam is reversed along one optical path to irradiate the subject, the energy absorption distribution generated in the thickness direction of the subject to be annealed is made constant to cause the solid-liquid interface to be flat along the optical path. Therefore, crystal growth in the lateral direction can be realized to form a large crystal grain.

A laser annealing apparatus of a fourth aspect of the invention includes a laser light source which emits a laser beam, an optical path along which the laser beam is transmitted through a subject to be annealed, and a mirror which reflects the laser beam transmitted through the subject so that a direction of the laser beam is reversed along the optical path along which the laser beam is transmitted through the subject, to irradiate the subject.

According to the above configuration, the laser beam emitted from the laser light source is transmitted through the subject at a first time, and the laser beam is reflected by the mirror to be transmitted through the subject at a second time.

Thus, since the operation in which the energy is absorbed is repeated two times when the laser beam is transmitted through the subject, the input energy of the laser beam can be utilized effectively. Further, since a direction of the laser beam is reversed along one optical path to irradiate the subject, the energy absorption distribution generated in the thickness direction of the subject to be annealed is made constant to cause the solid-liquid interface to be flat along the optical path. Therefore, crystal growth in the lateral direction can be realized to form a large crystal grain.

In the laser annealing apparatus of the second aspect or the third aspect, a laser annealing apparatus of a fifth aspect of the invention is intended for a subject to be annealed which is amorphous silicon having a film thickness in a range of 25 to 230 nm, and the laser light source oscillates a light beam of a second harmonic wave by using a Nd solid-state laser as an oscillation source.

According to the above configuration, in the case where the subject to be annealed is amorphous silicon (a-Si), high output-stability can be obtained by using the Nd solid-state laser as the laser light source. The absorption coefficient of amorphous silicon to the laser beam having a wavelength of around 500 nm is relatively small. The film thickness of amorphous silicon is formed substantially in the range of 25 to 230 nm. At this point, a direction of the laser beam is reversed along one optical path to irradiate the amorphous silicon layer, which is of subject with the laser beam. As a result, the energy absorption distribution generated in the thickness direction of the amorphous silicon layer is made constant to cause the solid-liquid interface to be flat along the optical path. This allows the solid-liquid interface to be easy to stand vertically, and a growth distance in the lateral direction can be taken longer to form the large crystal grain. Therefore, polysilicon (Poly-Si) having large carrier mobility can be generated and high-performance SOG-TFT can be realized.

In any one of the laser annealing apparatuses of the second to fifth aspect, it is preferable that the laser light source emits the light beam having a wavelength in a range of 400 nm to 460 nm by using of a GaN semiconductor laser.

When a laser wavelength λ becomes an ultraviolet region whose wavelength is less than 400 nm, photodecomposition is increased. When dust adhering to the mirror or the lens is irradiated with the laser beam, there is a possibility that the photodecomposition of the dust adhering to the mirror or the lens is generated to contaminate the mirror or the lens. However, according to the above configuration, the wavelength λ of the GaN semiconductor laser can be set to the range not lower than 400 nm, and the contamination of the mirror and the lens can be prevented. The upper limit of the wavelength λ of the GaN semiconductor laser is not more than 460 nm.

Further, a laser annealing apparatus of another aspect of the invention includes a laser light source which emits a laser beam, and an optical unit for forming an optical path along which the laser beam is transmitted through a film to be annealed provided in a subject of an annealing process, wherein the subject includes a film to be annealed and a reflecting film which reflects the laser beam transmitted through the film to be annealed so that a direction of the laser beam is reversed along an optical path along which the laser beam is transmitted through the film to be annealed.

BRIEF DESCRIPTION OF THE DRAWINGS

FIG. 2 is a view showing an optical path for annealing process in the laser annealing apparatus according to the embodiment of the invention.

FIG. 14A shows an example of a use area of DMD.
FIG. 14B shows an example of a use area of DMD.

FIG. 15 is a plan view for explaining an annealing method in which a transparent substrate is annealed by a single-time scanning of a scanner.

FIG. 21 shows the optical path for annealing process in which a light source emitting a light beam of 405 nm of a GaN semiconductor laser is used, in the laser annealing apparatus according to the embodiment of the invention.

FIG. 27 shows the optical path for annealing process, in which the substrate in which the optical device is integrally formed is annealed by one-time go and return of the laser beam, in the laser annealing apparatus according to the embodiment of the invention.

DETAILED DESCRIPTION OF THE INVENTION

Hereinafter, referring to the accompanying drawings, an embodiment will be described in detail, in which a method and an apparatus for laser annealing of the present invention are applied to the formation of the low-temperature polysilicon TFT.

Figure 17A:
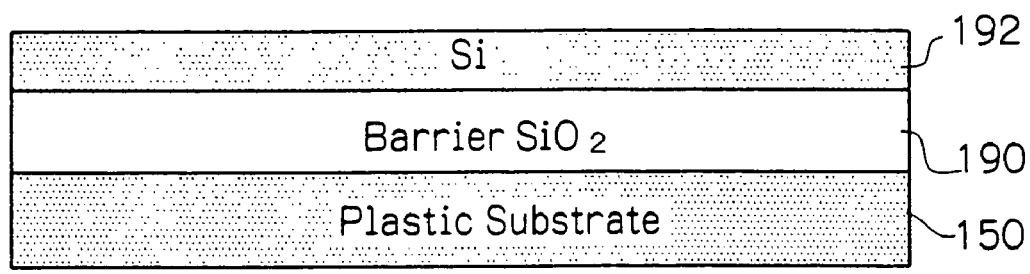
FIG. 17A is a view for illustrating a low-temperature polysilicon TFT forming process.

In a process of forming a low-temperature polysilicon TFT in which the laser annealing apparatus according to the present embodiment is used, as shown in FIG. 17A, a silicon oxide (SiO$_x$) insulating film 190 is deposited on a transparent substrate 150 made of glass or plastic, and an amorphous silicon film 192 is deposited on the SiO$_x$ insulating film 190.

Figure 17B:
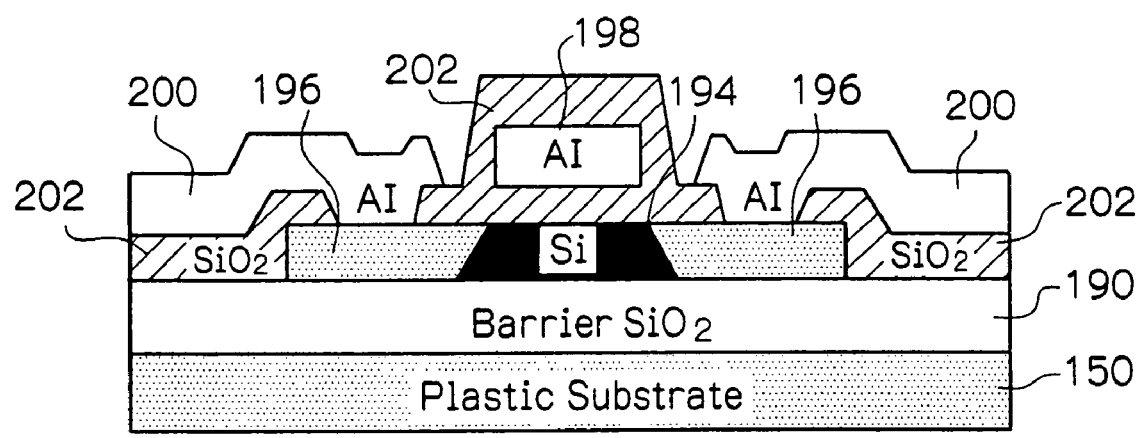
FIG. 17B is a view for illustrating a low-temperature polysilicon TFT forming process.

A polysilicon film, which is of the polycrystalline silicon film, is formed by performing laser annealing to the amorphous silicon film 192. Then, the polysilicon TFT is formed on the transparent substrate 150 through the SiO$_x$ insulating film 190 by using photolithography techniques. For example, as shown in FIG. 17B, the polysilicon TFT including a polysilicon gate 194, a polysilicon source/polysilicon drain 196, a gate electrode 198, a source/drain electrode 200, and an interlayer insulating film 202.

[Configuration of Laser Annealing Apparatus]

Figure 1:
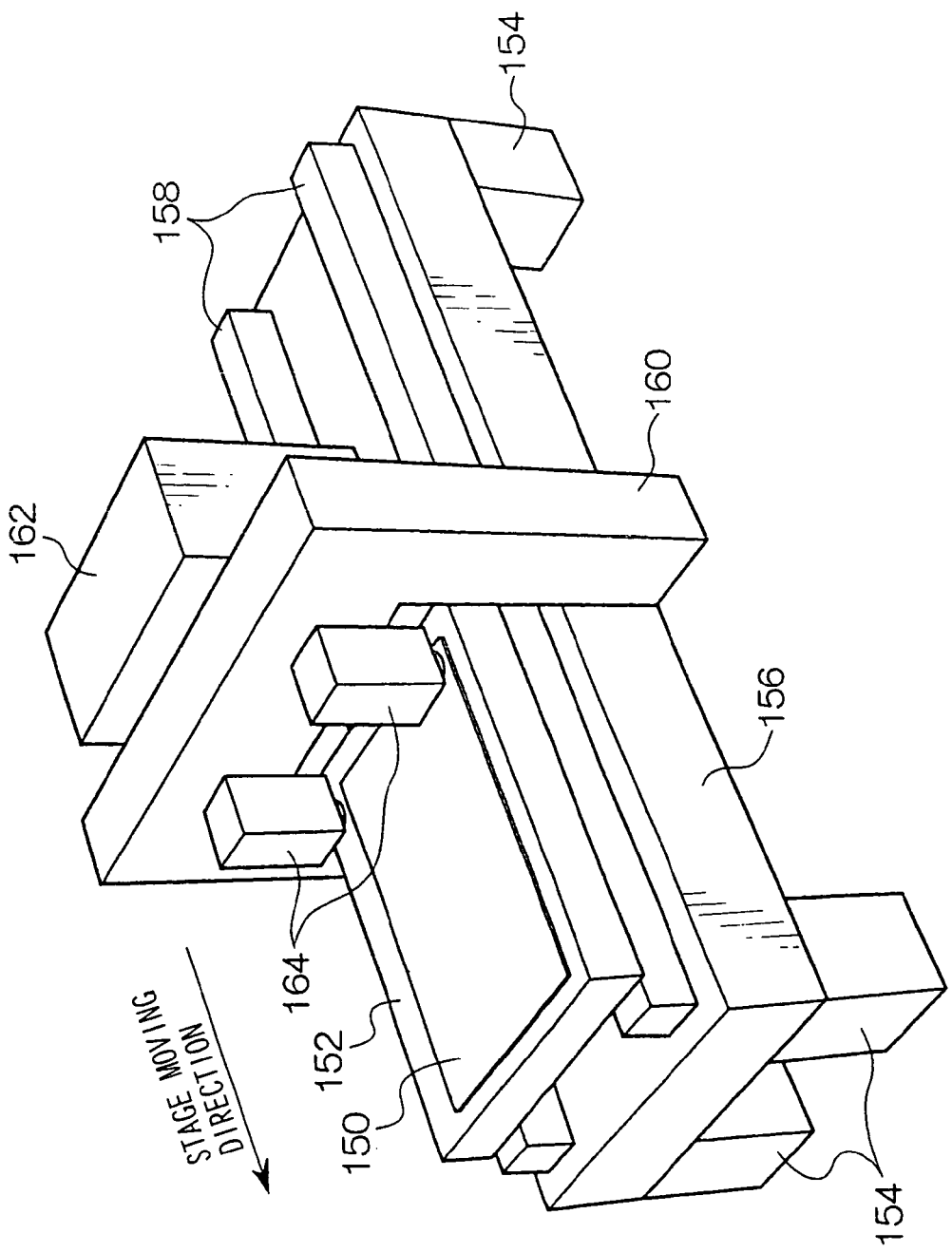
FIG. 1 is a perspective view showing an appearance of a laser annealing apparatus according to an embodiment of the present invention.

As shown in FIG. 1, the laser annealing apparatus according to the present embodiment includes a flat stage 152. The transparent substrate 150 is adhered and held on a surface of the flat stage 152. An amorphous silicon film as a subject to be annealed is deposited on the transparent substrate 150. Two guides 158 extending along a stage traveling direction are arranged on an upper surface of a thick plate-shaped setting bench 156 supported by four legs 154. The stage 152 is reciprocably supported by the two guides 158, while arranged so that a longitudinal direction of the stage 152 is oriented to the stage traveling direction. A driving device (not shown) for driving the stage 152 along the two guides 158 is provided in the laser annealing apparatus.

At the central portion of the setting bench 156, a U-shaped gate 160 is provided so as to bridge a traveling path of the stage 152. Each end portion of the U-shaped gate 160 is fixed to each side face of the setting bench 156. A scanner 162 is provided on one side of the gate 160, and plural sensors 164 (for example two sensors) which sense a front end and a back end of the transparent substrate 150 are provided on the other side of the gate 160. The scanner 162 and the sensors 164 are individually fitted to the gated 160 so as to be fixedly arranged above the traveling path of the stage 152. The scanner 162 and the sensors 164 are connected to a controller (not shown) which controls the scanner 162 and the sensors 164.

In order to be able to perform the laser annealing method in which a direction of a laser beam is reversed to irradiate the a-Si layer so that the laser beam is transmitted through the a-Si film plural times, a laser direction reversed irradiation mechanism shown in FIG. 2 is formed from the scanner 162 to a backside of the stage 152 in the laser annealing apparatus.

In the laser direction reversed irradiation mechanism, a second harmonic wave of the laser beam emitted from a Nd solid-state laser is used as a laser light source 300. In the laser light source 300, it is possible to provide a wavelength modulator for a third harmonic wave and a fourth harmonic wave (not shown).

The reason why the second harmonic wave of the laser beam emitted from the Nd solid-state laser is used as the laser light source 300 is as follows.

The case in which light energy incident to the substrate 150 to be annealed from the laser light source 300 is absorbed in the a-Si layer will be described. In consideration of an amount of energy which is absorbed in a thin film layer (thickness) Δd within the a-Si layer, the amount of energy absorbed in the range from the surface to a depth d becomes $P_o\exp(-\alpha d)$, where input energy is $P_o$ and the absorption coefficient is α. The amount of energy absorbed in the range from the surface to the depth d+Δd becomes $P_o\exp(-\alpha(d+\Delta d))$. Therefore, the amount of energy absorbed in the layer thickness Δd becomes $P_o\{\exp(-\alpha d)-\exp(-\alpha(d+\Delta d))\}$, so that the following equation holds.

$$\lim_{\Delta d \to 0} \frac{P_0\{\exp(-\alpha d) - \exp(-\alpha(d+\Delta d))\}}{d-(d+\Delta d)} = \frac{d\{(P_0\exp(-\alpha d))\}}{dd}$$

Accordingly, the amount of energy Pd absorbed at a certain depth d can be expressed by $Pd=P_o\alpha\exp(-\alpha d)$.

Figure 3:
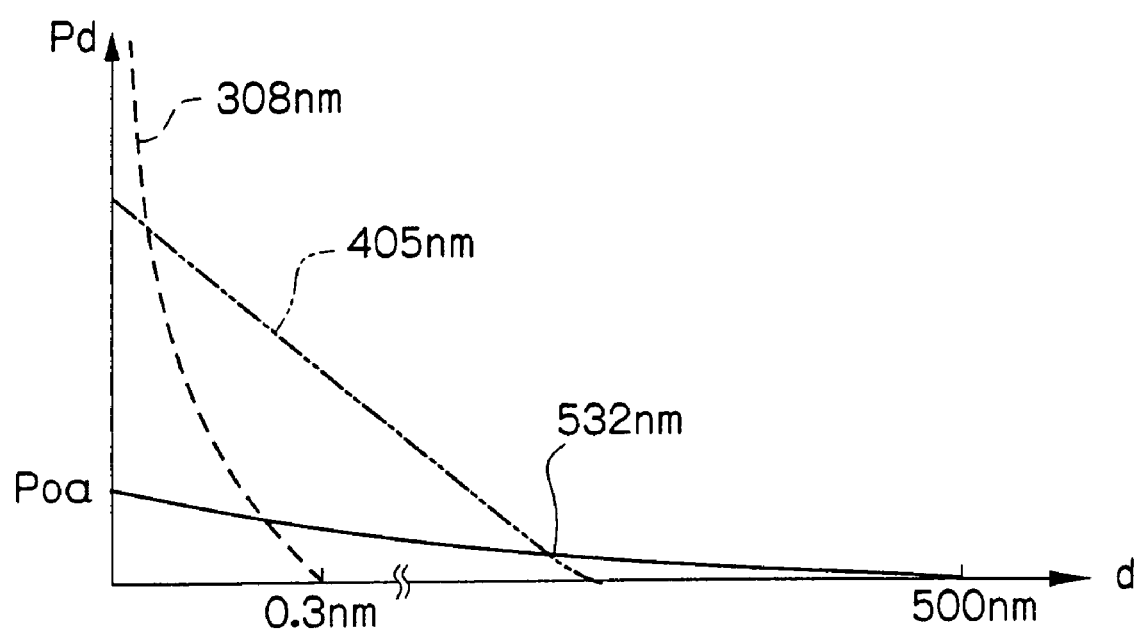
FIG. 3 is a graph showing absorption characteristics of amorphous silicon to wavelengths of each laser in the laser annealing apparatus according to the embodiment of the invention.

FIG. 3 shows the state of the energy absorption of the light beam having the wavelength of 532 nm in the a-Si film. The absorption starts from the surface and decreases exponentially within the film, and the input energy $P_o$ is absorbed completely at the film thickness of 500 nm. In FIG. 3, an area surrounded by an X-axis, a Y-axis, and the exponential curve corresponds to the input energy $P_o$. Since the energy absorption occurs as shown in FIG. 3, the temperature in the film also has substantially the same distribution as FIG. 3.

The solid-liquid interface also reflects the temperature distribution, and the distribution of the solid-liquid interface becomes near perpendicular to the a-Si film surface (i.e., becomes as shown in FIG. 3). Therefore, the crystal growth is not restricted by the film thickness because the crystal growth proceeds in the film surface direction.

However, since the absorption coefficient of the laser beam having a wavelength of 532 nm is $5 \times 10^4$ cm$^{-1}$, only about 22% of the input energy is absorbed in the case where the film thickness is 50 nm. In order to input the required energy for the crystallization into the a-Si layer, it is necessary to increase the input energy. Therefore, the laser annealing method, in which a direction of the laser beam having a wavelength of 532 nm is reversed to irradiate the a-Si film so that the laser beam is transmitted through the a-Si film plural times, is applied in the invention. As a result, the laser beam having a wavelength of 532 nm is sufficiently absorbed in the thin layer of about 50 nm, the input energy is utilized without waste of the input energy, and the crystal growth in the lateral direction can be realized without being restricted by the film thickness. The vertical formation of the solid-liquid interface and the crystallization of the thin film, which provide good effect on the formation of a large crystal grain, can be realized at the same time. This allows the energy absorption distribution within the film generated in the film thickness direction to be held at constant.

In the laser annealing method in which a direction of a laser beam is reversed to irradiate the a-Si film so that the laser beam is transmitted through the a-Si film plural times, the relationship among the absorption coefficient $\alpha(\lambda)$, the film thickness d, and the number of reverse times n will be described below.

When the input energy $P_o$ passes through the film thickness d having the absorption coefficient $\alpha(\lambda)$, the input energy P expressed by $P=P_o \cdot \exp(-\alpha(\lambda) \cdot d)$. Accordingly, the amount of energy absorbed at the film thickness d becomes $P_d = P_o e(1-\exp(-\alpha(\lambda) \cdot d))$.

An absorptance $\eta_{abs}$ can be expressed by the following equation.

$$\eta_{abs} = 1 - \exp(-\alpha(\lambda) \cdot d) \quad (1)$$

The presence of the effective absorption area of the light energy inputted into the film thickness is defined by the following equation (2). Further, the effective utilization of the inputted light energy is defined by the following equation (3).

$$\eta_{abs} = 0.99 \quad (2)$$

$$\eta_{abs} = 0.4 \quad (3)$$

The equations (1) and (2) lead to $\exp(-\alpha(\lambda) \cdot d) = 0.01$, so that the following equation (4) is obtained.

$$\alpha(\lambda) \cdot d \approx 4.6 \quad (4)$$

The equations (2) and (3) also lead to $\exp(-\alpha(\lambda) \cdot d) = 0.6$, so that the following equation (5) is obtained.

$$\alpha(\lambda) \cdot d \approx 0.5 \quad (5)$$

The equations (4) and (5) lead to the following equation (6) in which energy loss is within a permissible range and the effect of the both-side irradiation is effectively generated.

$$0.5 \leq \alpha(\lambda) \cdot d \leq 4.6 \quad (6)$$

At this point, when the path along which the laser beam travels back and forth through the film is formed, the laser beam reversing appears to be remarkably effective. Accordingly, the equation (6) becomes the following equation (7).

$$0.5/2n \leq \alpha(\lambda) \cdot d \leq 4.6/2n \quad (7)$$

Here, the number of reverse times is set to n.

Therefore, the relationship among the absorption coefficient $\alpha(\lambda)$, the film thickness d, and the number of reverse times n is defined by the equation (7).

When the calculation is performed to such as the laser annealing method in which a direction of the laser beam having a wavelength of 532 nm is reversed to irradiate the a-Si film so that the laser beam is transmitted through the a-Si film plural times, the equation (7) can be expressed as follows.

$$0.5/2n \leq \alpha(532 \text{ nm}) \cdot d \leq 4.6/2n \quad (7)$$

d: film thickness, the thickness of the a-Si film actually irradiated

α (532 nm): the coefficient dependent on a-Si and the wavelength an integer n satisfying the equation (7) is obtained as follows.

$\alpha(532 \text{ nm}) = 5 \times 10^4$ cm$^{-1}$ d=50 nm $$0.5 \leq 2n \cdot \alpha(532 \text{ nm}) \cdot d \leq 4.6$$

$$0.5 \leq 0.5n \leq 4.6$$

n=1, 2, . . . , 9

As an example of the laser annealing process, the case will be described, in which amorphous silicon (a-Si) is the subject to be annealed, the film thickness of the amorphous silicon ranges from 25 nm to 230 nm, the laser light source emits the light beam of the second harmonic wave by using a Nd solid-state laser as the oscillation source, and a direction of the laser beam is reversed to irradiate the a-Si film two times (the number of reverse times n=2).

In this case, high output-stability can be obtained by using the Nd solid-state laser as the laser light source. The absorption coefficient of amorphous silicon to the laser beam having the wavelength of around 500 nm is relatively small. The film thickness of amorphous silicon, which is of the subject to be annealed, is formed substantially in the range of 25 to 230 nm. At this point, a direction of the laser beam is reversed along one optical path to irradiate the amorphous silicon layer, which is of subject for the laser beam. As a result, the energy absorption distribution generated in the thickness direction of the amorphous silicon layer is made constant to cause the solid-liquid interface to be flat along the optical path. This allows the solid-liquid interface to be easy to stand vertically, and a growth distance in the lateral direction can be long to form a large crystal grain. Therefore, polysilicon (poly-Si) having large carrier mobility can be produced and high-performance SOG-TFT can be realized.

In amorphous silicon, which is of the subject to be annealed, the reason why the film thickness substantially ranges from 25 nm to 230 nm is as follows.

When numerical values of the number of reverse times n=2 and $\alpha(532 \text{ nm}) = 5 \times 10^4$ cm$^{-1}$ are substituted into the above conditional equation, $0.5/2 \text{ n} \leq \alpha((532 \text{ nm}) \cdot d \leq 4.6/2 \text{ n}$ (7), in which the laser beam reversing is effectively performed to express the film thickness d in the form of an inequality, 25 nm≤d≤230 nm is obtained. Accordingly, the amorphous silicon film thickness for which two-time reversed irradiation is effective substantially ranges from 25 nm to 230 nm.

In FIG. 2, the case in which plural Nd:YVO$_4$SHG laser light sources using Nd:YVO$_4$ laser as the Nd solid-state laser are used as the laser light source is considered. In the laser direction reversed irradiation mechanism in the laser annealing apparatus, the light beam having a wavelength of 532 nm (second harmonic wave) emitted by the plural Nd:YVO$_4$SHG laser light sources 300 is formed in the light beam having the desired beam intensity by a corresponding beam forming optical system 302 and a corresponding spatial light modulator 304.

The optical path is formed in the laser direction reversed irradiation mechanism. In the optical path, the laser beam having the wavelength of 532 nm formed in the desired beam intensity is reflected by a mirror 306 configured corresponding to the laser beams having the wavelength of 532 nm emitted from all the laser light sources 300, transmitted through a polarization beam splitter 308, and projected into the a-Si film on the substrate 150 of the subject by a lens 310 (cylindrical lens).

Thus, the light energy projected into the a-Si film on the substrate 150 of the subject is partially absorbed in the a-Si film, and other part of the light energy is transmitted through the a-Si film as the light beam.

The optical path is formed in the laser direction reversed irradiation mechanism as described below. Along the optical path, the light beam transmitted through the substrate 150 of the subject is formed by a lens 312 (cylindrical lens), transmitted through a quarter-wave plate 314 to be converted into a circularly polarized light beam, reflected by a mirror 316, transmitted through the quarter-wave plate 314 again to be converted into a linearly polarized light beam orthogonal to the light beam having a wavelength of 532 nm (second harmonic wave) emitted by each of the Nd:YVO$_4$SHG laser light sources 300, and projected at a second time from a backside of the a-Si film on the substrate 150 of the subject by the lens 312.

Thus, the light energy projected from the backside of the a-Si film on the substrate 150 is partially absorbed in the a-Si film again, and other part of the light energy is transmitted through the a-Si film as the light beam.

The optical path is formed in the laser direction reversed irradiation mechanism as described below. In the optical path, the light beam of the linearly polarized light which is transmitted through the a-Si film and is orthogonal to the light beam emitted from the laser light source is transmitted through a lens 310, reflected by the polarization beam splitter 308, reflected by a mirror 318, reflected by the polarization beam splitter 308 again, and projected at a third time into the a-Si film on the substrate 150 by the lens 310.

Thus, the light energy projected at the third time into the a-Si film on the substrate 150 is partially absorbed in the a-Si film again, and other part of the light energy is transmitted through the a-Si film as the light beam.

The light beam transmitted by the third-time projection is subjected to shape formation by the lens 312, transmitted through the quarter-wave plate 314 to be converted into a circularly polarized light beam, reflected by the mirror 316, transmitted through the quarter-wave plate 314 again to be converted into the light beam in the same polarization direction as the light beam having a wavelength of 532 nm (second harmonic wave) emitted by each of the Nd:YVO$_4$SHG laser light sources 300, and projected at a fourth time from the backside of the a-Si film on the substrate 150 of the subject by the lens 312. The lens 312, the quarter-wave plate 314, and the mirror 316 are disposed in the optical path formed at the backside of the substrate 150.

Thus, the light energy projected at the fourth time from the backside of the a-Si film on the substrate 150 is partially absorbed in the a-Si film again. Other part of the light energy is transmitted through the a-Si film as the light beam, and the light beam is transmitted through the lens 310 to form the light beam in the same polarization direction as the light beam having a wavelength of 532 nm (second harmonic wave) emitted by each of the Nd:YVO$_4$SHG laser light sources 300. Then, the light beam is transmitted through the polarization beam splitter 308.

Since the light beam having the wavelength of 532 nm travels twice back and forth through the a-Si film (transmitted four times) through the above processes, the a-Si film having the thickness of 50 nm can realize the absorption of the energy corresponding to the light energy absorbed in the film thickness of 200 nm.

Figure 4A:
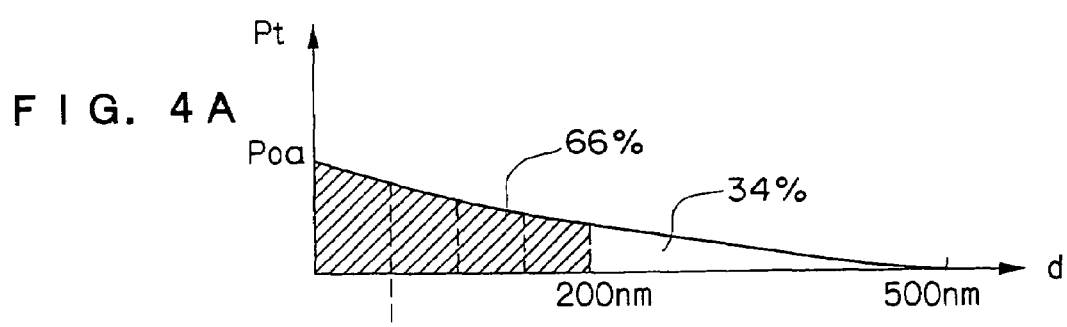
FIG. 4A is a graph showing the absorption characteristics of amorphous silicon, in which an amount of absorption of light energy corresponding to a film thickness of 200 nm is illustrated when a laser beam having the wavelength of 532 nm is used in the laser annealing apparatus according to the embodiment of the invention.

As shown in cross-hatching shown in FIG. 4A, the energy corresponding to the light energy absorbed in the film thickness of 200 nm is absorbed, and the absorption energy is increased to about 66% of the input energy.

Figure 4B:
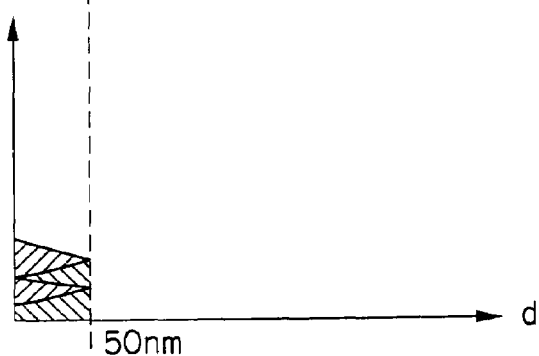
FIG. 4B is a graph illustrating an absorption state when a direction of the laser beam having a wavelength of 532 nm is reversed four times in the film thickness of 50 nm.
Figure 4C:
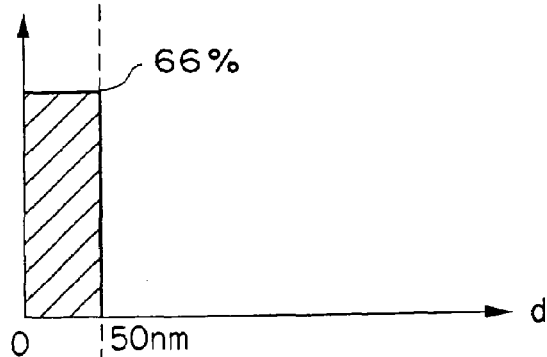
FIG. 4C is a graph showing a distribution state in which the laser beam having a wavelength of 532 nm is substantially uniformly absorbed in a depth direction of the film thickness when a direction of the laser beam is reversed four times in the film thickness of 50 nm.

Since a direction of the light is reversed four times within the film thickness of 50 nm as shown in FIG. 4B (transmitted four times), the absorbed input energy has a distribution state in which the input energy is substantially uniformly absorbed in the depth direction of the film thickness within the film thickness of 50 nm as shown in FIG. 4C.

Figure 4D:
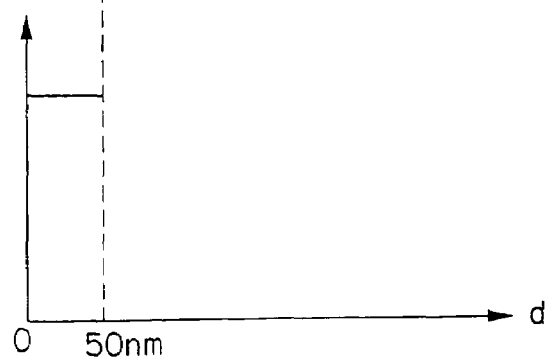
FIG. 4D is a graph showing a temperature distribution state in a thickness direction of a film when a direction of the laser beam having a wavelength of 532 nm is reversed four times in the film thickness of 50 nm.

In this case, the temperature distribution in the a-Si film depends on the uniform absorption energy distribution to have a distribution in which the temperature distribution is approximately constant in the depth direction of the film thickness as shown in FIG. 4D.

Accordingly, the waste of the input energy is decreased, and a uniform temperature distribution in the depth direction of the film thickness is realized, compared with the case of one-pass in which the light beam having the wavelength of 532 nm is transmitted the a-Si film only once. As a result, the input energy can be utilized with less waste of the energy in the relatively thin film thickness of about 50 nm, the crystal growth in the lateral direction can be realized without being restricted by the film thickness, and the contradictory demands of the vertical formation of the solid-liquid interface which is effective to the formation of a large crystal grain and the crystallization of a thin film can be balanced.

Since the operation in which the energy is absorbed is repeated plural times when the laser beam is transmitted through the subject, the energy can be utilized without waste of the input energy. Further, since a direction of the laser beam is reversed along one optical path to irradiate the subject, the energy absorption distribution generated in the thickness direction of the subject to be annealed is made constant to cause a solid-liquid interface to be flat along the optical path. Therefore, crystal growth in the lateral direction can be realized to form a large crystal grain.

The example has been described above in the laser direction reversed irradiation mechanism in the above laser annealing apparatus, including each optical system 302 and each spatial light modulator (DMD) 304 corresponding to each of the plural laser light sources 300, and including the mirror 306, the polarization beam splitter 308, the lens 310, the lens 312, the quarter-wave plate 314, the mirror 316, and the mirror 318 which correspond to the whole of the plural laser light beams 300. However, it is possible to provide the mirror 306, the polarization beam splitter 308, the lens 310, the lens 312, the quarter-wave plate 314, the mirror 316, and the mirror 318 so as to correspond to the plural laser light sources 300 one-on-one.

In the laser direction reversed irradiation mechanism in the laser annealing apparatus shown in FIG. 2, the spatial light modulator 304 can be formed by the digital micromirror device (DMD) which is of the spatial light modulator modulating the incident light beam in each pixel according to data. The spatial light modulator (DMD) 304 is connected to a controller (not shown) including a data processing unit and a mirror driving control unit. In the data processing unit of the controller, a control signal, which drives and controls each micromirror in the area to be controlled in each spatial light modulator 304, is generated on the basis of the inputted data. The data is one which density of each pixel is expressed in the binary value (presence or absence of dot recording). In the mirror driving control unit, an angle of a reflection plane of each micromirror is controlled in each spatial light modulator 304 on the basis of the control signal generated by the data processing unit.

Figure 5:
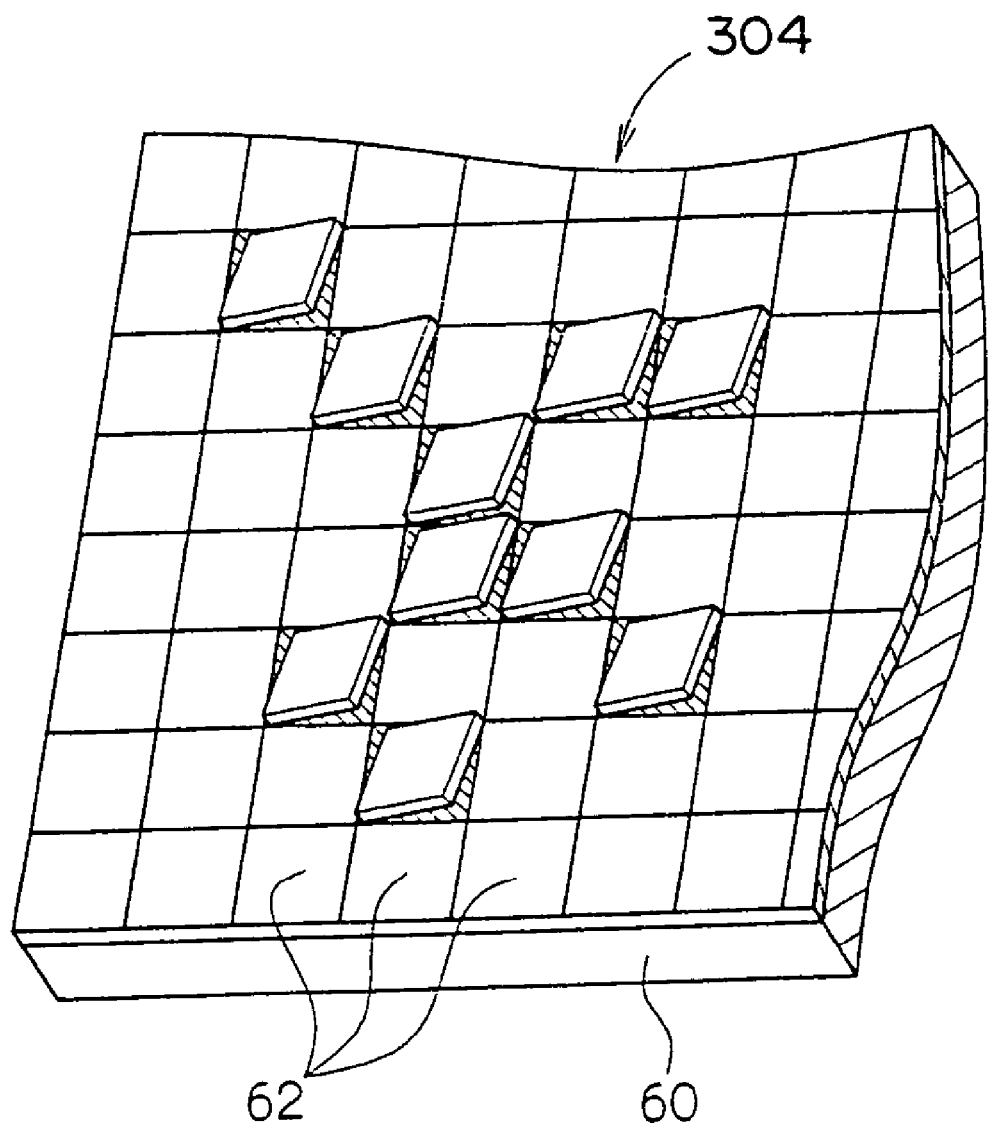
FIG. 5 is a partially expanded view showing a configuration of a digital micromirror device (DMD) in the laser annealing apparatus according to the embodiment of the invention.

As shown in FIG. 5, the spatial light modulator (DMD) 304 is a mirror device in which micromirrors 62 are arranged and supported by supports on an SRAM cell (memory cell) 60 and many micromirrors (for example, 600 pieces by 800 pieces) constituting the pixel are arrayed in the form of a matrix. The micromirror 62 supported by the support is provided at an uppermost portion of each pixel, and a material having high reflectance such as aluminum is deposited on the surface of the micromirror 62. The reflectance of the micromirror 62 is not lower than 90%. The SRAM cell 60 of CMOS silicon gate manufacture by a usual manufacturing line of a semiconductor memory is arranged immediately below the micromirrors 62 through the support including a hinge and a yoke, and the spatial light modulator (DMD) 304 is formed in monolithic (integral type).

Figure 6A:
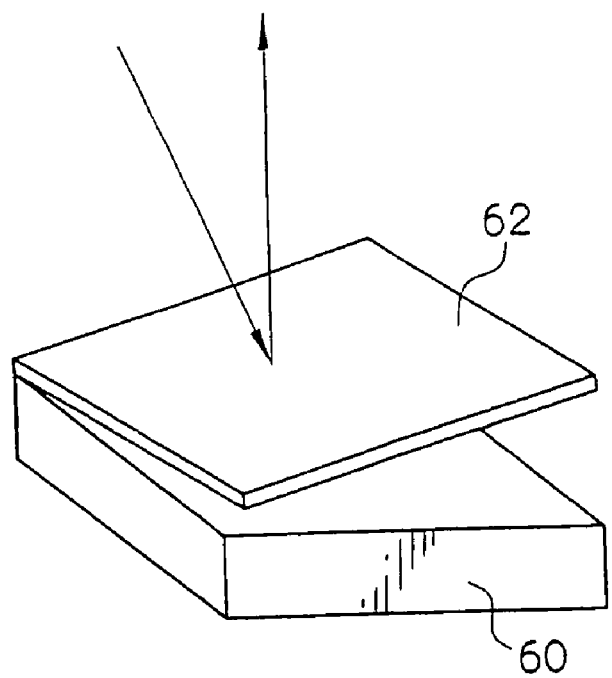
FIG. 6A is a view for illustrating operation of DMD.
Figure 6B:
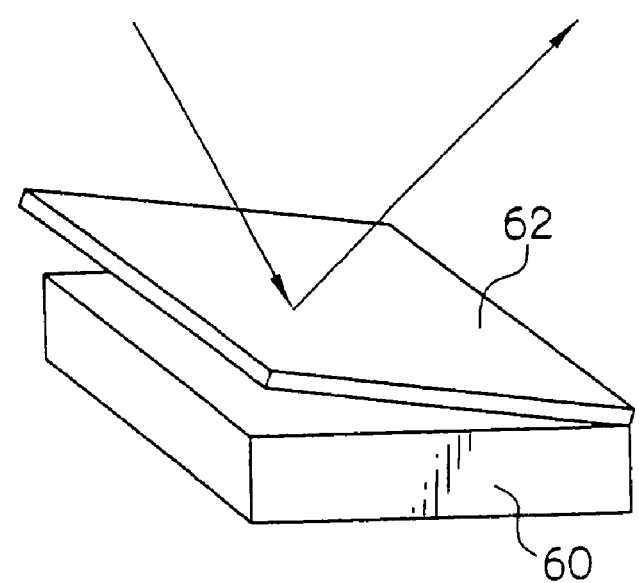
FIG. 6B is a view for illustrating operation of DMD.

When a digital signal is written in the SRAM cell 60 of the spatial light modulator (DMD) 304, the micromirror 62 supported by the support is inclined within the range of $\pm\alpha$ degrees (for example, $\pm10$ degrees) about a diagonal of the micromirror 62 relative to the substrate side on which the spatial light modulator (DMD) 304 is arranged. FIG. 6A shows the on-state in which the micromirror 62 is inclined by $+\alpha$ degrees and FIG. 6B shows the off-state in which the micromirror 62 is inclined by $-\alpha$ degrees. The light incident to the spatial light modulator (DMD) 304 is reflected toward the direction in which each micromirror 62 is inclined by controlling the inclination of the micromirror 62 in each pixel of the spatial light modulator (DMD) 304 according to the data signal as shown in FIGS. 6A and 6B.

FIGS. 6A and 6B show examples of the state in which the micromirror 62 is controlled to $+\alpha$ degrees or $-\alpha$ degrees while a part of the spatial light modulator (DMD) 304 is enlarged. The on-off control of each micromirror 62 is performed by the controller (not shown) connected to the spatial light modulator (DMD) 304. A light absorber (not shown) is arranged in the direction in which the light beam is reflected by the micromirror 62 in the off-state.

Figure 7A:
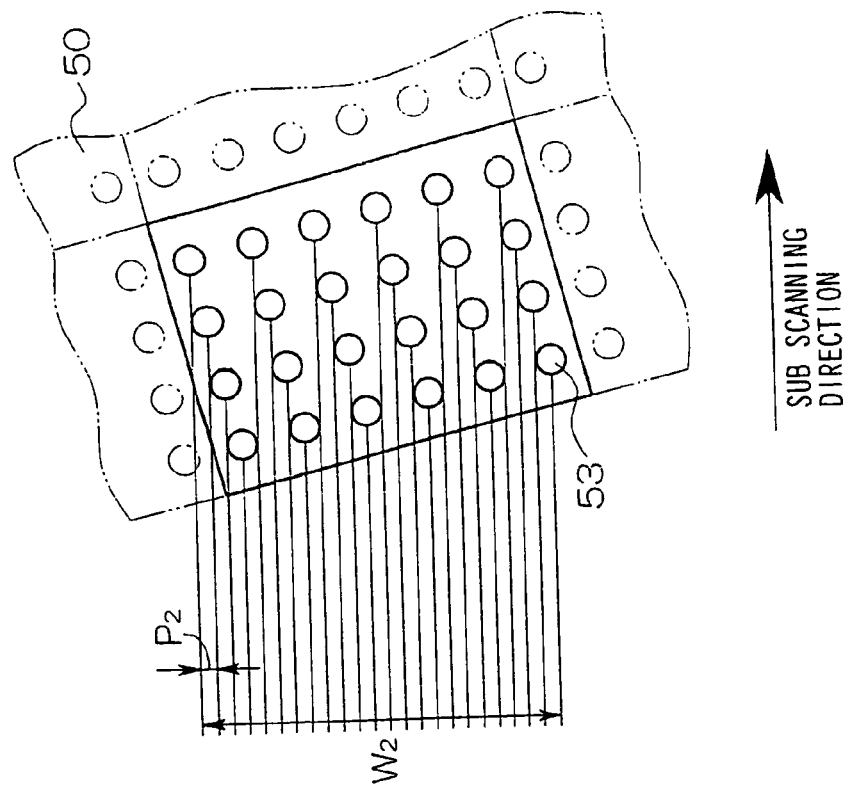
FIG. 7A is a plan view showing arrangement and scanning lines of a scanning beam, while the case in which DMD is not obliquely arranged and the case in which DMD is obliquely arranged are compared.
Figure 7B:
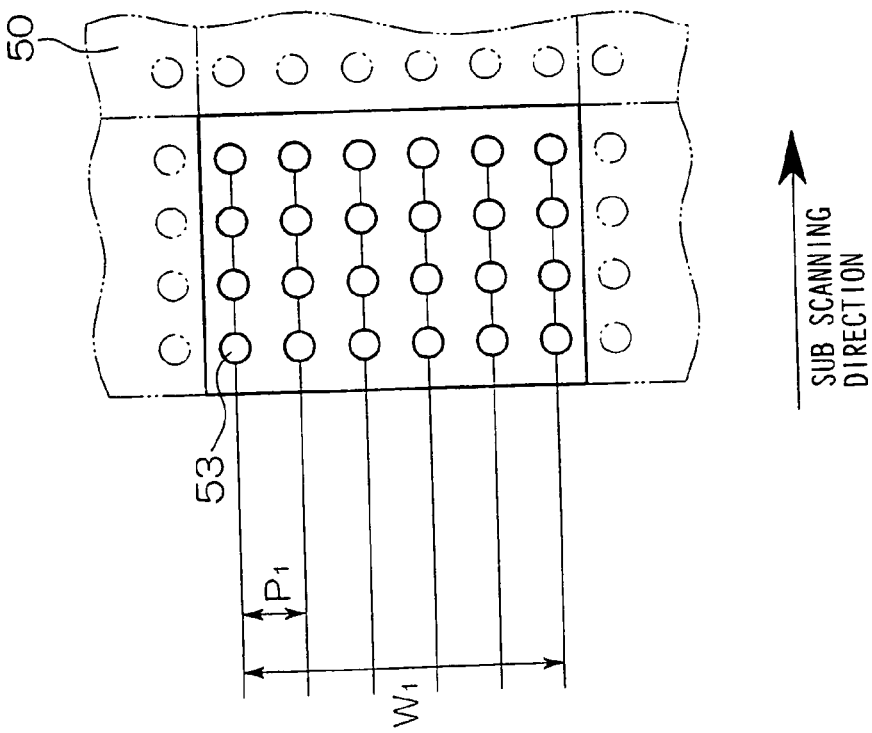
FIG. 7B is a plan view showing arrangement and scanning lines of a scanning beam, while the case in which DMD is not obliquely arranged and the case in which DMD is obliquely arranged are compared.

It is preferable that the spatial light modulator (DMD) 304 is slightly obliquely arranged so that a short side of the spatial light modulator (DMD) 304 and a sub scanning direction form a predetermined angle θ (for example, 1° to 5°). FIG. 7A shows a scanning trajectory of a reflected light figure (irradiation beam) 53 generated by each micromirror in the case where the spatial light modulator (DMD) 304 is not inclined, and FIG. 7B shows a scanning trajectory of an irradiation beam 53 in the case where the spatial light modulator (DMD) 304 is inclined.

In the spatial light modulator (DMD) 304, many sets (for example, 600 sets) of micromirror columns in which many micromirrors (for example, 800 pieces) are arrayed in the direction of a long side are arrayed in the direction of the short side. As shown in FIG. 7B, a pitch $P_2$ of the scanning trajectory (scanning line) of the irradiation beam 53 of each micromirror is narrowed by inclining the spatial light modulator (DMD) 304, compared with a pitch $P_1$ of the scanning line in the case where the spatial light modulator (DMD) 304 is not inclined, so that the resolution is remarkably increased. On the other hand, since the inclination angle of the spatial light modulator (DMD) 304 is minute, a scanning width $W_2$ in the case where the spatial light modulator (DMD) 304 is inclined is substantially equal to a scanning width $W_1$ in the case where the spatial light modulator (DMD) 304 is not inclined.

The multiple laser irradiation of one scanning line (multiple exposures) is performed by the different micromirror columns. As a result of the multiple exposures, a laser irradiation position can be finely controlled, and fine annealing can be realized. Joint gaps between the plural laser light sources 300 arrayed in a main scanning direction can be continuously connected by finely controlling the laser irradiation position.

The same effect can also be obtained by shifting each micromirror column in the direction orthogonal to the sub scanning direction at a predetermined interval to form a staggered arrangement, instead of the inclination of the spatial light modulator (DMD) 304.

In the laser direction reversed irradiation mechanism in the laser annealing apparatus, the light energy distribution projected into a microscopic band-shaped region of the a-Si film on the substrate 150 is adjusted by utilizing the spatial light modulator (DMD) 304 so that, in such a manner that, the light energy is increased on the front end side in the conveying direction of the substrate 150 and gradually decreased toward the back end side of the conveying direction. As a result, the temperature distribution in the a-Si film becomes more uniform, and it is possible to control the temperature distribution so as to become constant with respect to the film thickness direction.

Another Configuration of Laser Annealing Apparatus

The configuration of the laser direction reversed irradiation mechanism in the laser annealing apparatus shown in FIG. 18 will be described below.

Figure 18:
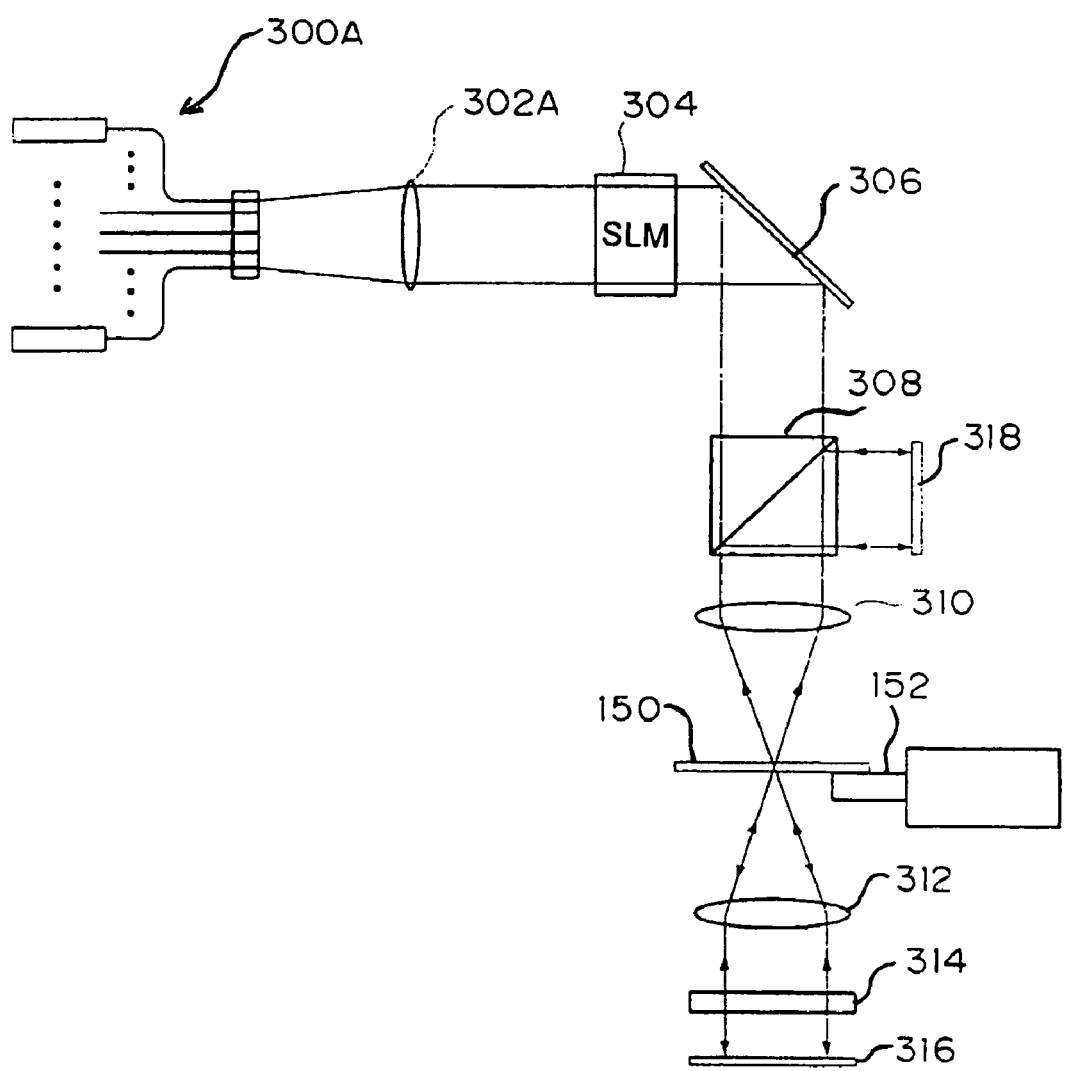
FIG. 18 shows the optical path for annealing process in which the fiber array light source is used, in the laser annealing apparatus according to the embodiment of the invention.

The laser direction reversed irradiation mechanism shown in FIG. 18 is configured by using a fiber array light source 300A as the laser light source 300 and utilizing a beam forming optical system 302A which forms the laser beam emitted from a laser emission unit arrayed in line along the main scanning direction orthogonal to the sub scanning direction into the light beam having the desired beam intensity. Configurations other than the above are the same as the laser direction reversed irradiation mechanism shown in FIG. 2.

Figure 8A:
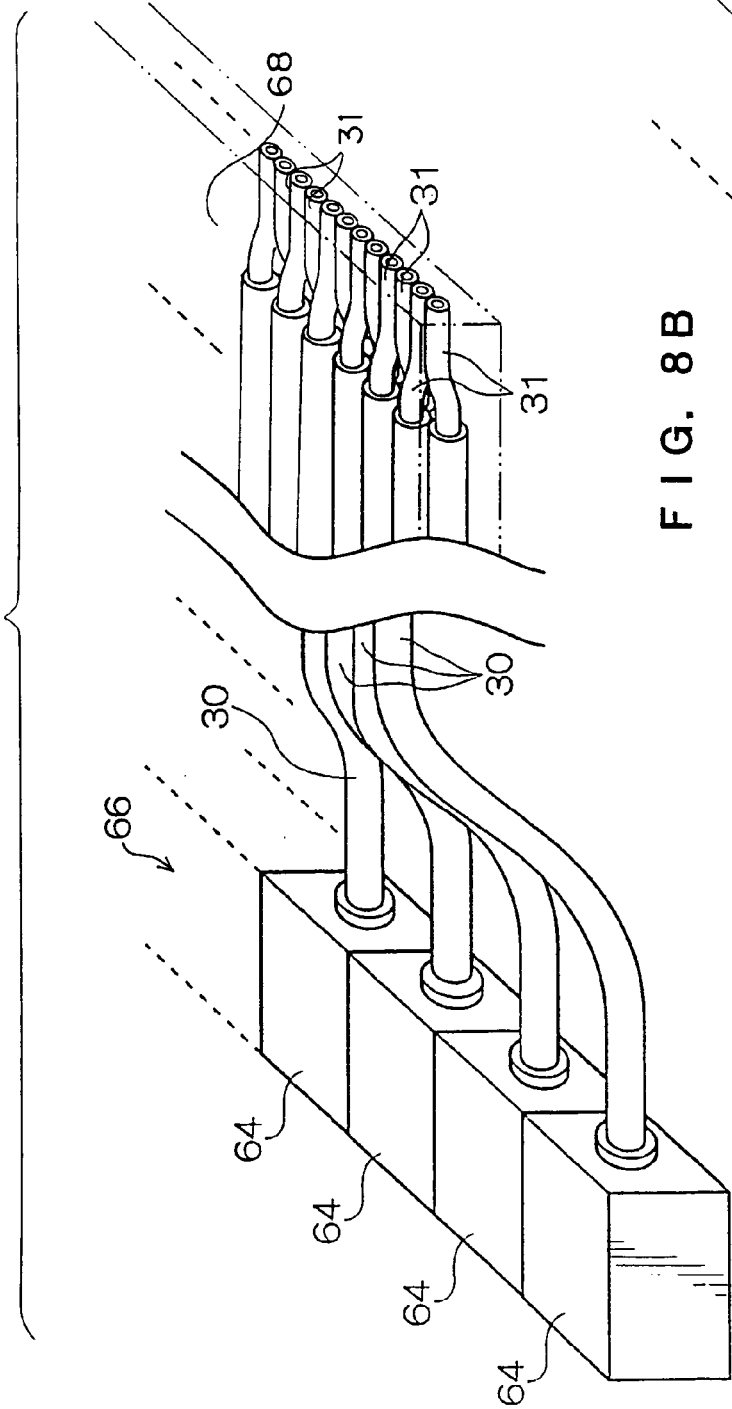
FIG. 8A is a perspective view showing the configuration of a fiber array light source in the laser annealing apparatus according to the embodiment of the invention.

As shown in FIG. 8A, the fiber array light source 300A includes many laser modules 64 and each laser module 64 is connected to one end of a multi-mode optical fiber 30. The other end of the multi-mode optical fiber 30 is connected to an optical fiber 31. A core diameter of the optical fiber 31 is equal to that of the multi-mode optical fiber 30 and a clad diameter of the optical fiber 31 is smaller than that of the multi-mode optical fiber 30. A laser-outgoing unit 68 is configured by arraying light-outgoing end portions (light-emission point) of the optical fibers 31 in line along the main scanning direction orthogonal to the sub scanning direction.

It is also possible to array the light-emission points in plural columns along the main scanning direction.

Figure 8B:
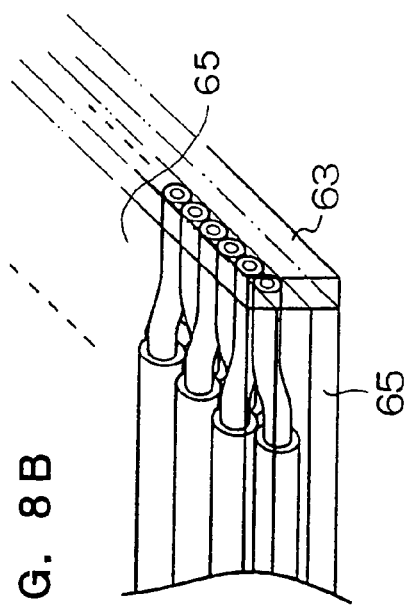
FIG. 8B is a partially expanded view of FIG. 8A.

As shown in FIG. 8B, the light-outgoing end portion of the optical fiber 31 is fixed while the optical fiber is sandwiched by two support plates 65 whose surfaces are flat. On the light-outgoing side of the optical fiber 31, a transparent protective plate 63 made of glass or the like is disposed in order to protect an end face of the optical fiber 31. It is possible that the protective plate 63 is disposed so as to come into close contact with the end face of the optical fiber 31, and it is also possible that the protective plate 63 is disposed so that the end face of the optical fiber 31 is sealed. In the light-outgoing end portion of the optical fiber 31, light density is high, dust is easy to gather, and degradation is likely to occur. However, provision of the protective plate 63 can prevent the dust from adhering to the end face and can delay progression of the degradation.

In this example, in order that the light-outgoing ends of the optical fibers 31 having the smaller clad diameter are arrayed in line without gap, the multi-mode optical fiber 30 is stacked between two multi-mode optical fibers 30 adjacent to each other in the region where the clad diameter is larger, and the light-outgoing end of the optical fiber 31 connected to the stacked multi-mode optical fiber 30 is disposed so as to be sandwiched between two light-outgoing ends of the optical fibers 31 connected to the two multi-mode optical fibers 30 adjacent to each other in the region where the clad diameter is larger.

Figure 9:
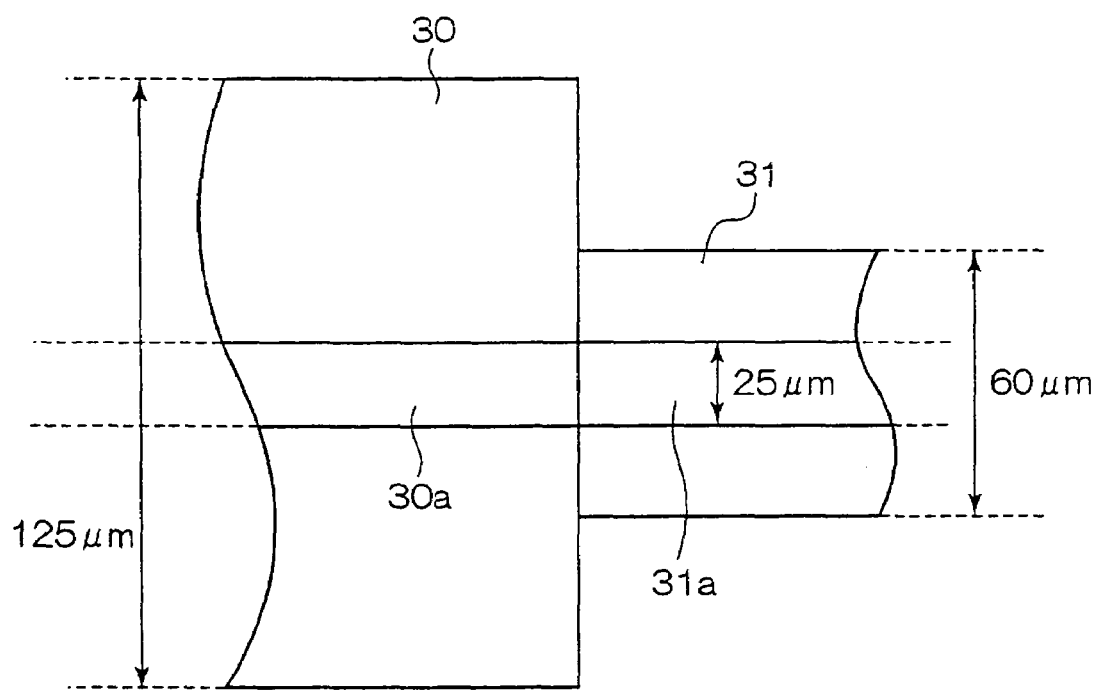
FIG. 9 shows the configuration of a multi-mode optical fiber.

For example, as shown in FIG. 9, the above optical fiber can be obtained by coaxially connecting the optical fiber 31 having the smaller clad diameter and a length of 1 to 30 cm to the front end portion on the laser beam outgoing side of the multi-mode optical fiber 30 having a larger clad diameter. In the two optical fibers, the incident end face of the optical fiber 31 is fused and connected to the outgoing end face of the multi-mode optical fiber 30 so that central axes of the both optical fibers correspond to each other. As described above, the diameter of a core 31*a* of the optical fiber 31 is equal to the diameter of a core 30*a* of the multi-mode optical fiber 30.

It is also possible that the short optical fiber, in which an optical fiber having a smaller clad diameter is fused to a short optical fiber having a larger clad diameter, is connected to the light-outgoing end of the multi-mode optical fiber 30 through a ferrule, an optical connector, or the like. When the optical fiber having a smaller diameter is damaged, replacement of the front end portions becomes easy by detachably connecting the optical fibers using the optical connector or the like, and cost required for maintenance of an irradiation head can be decreased. Hereinafter sometimes the optical fiber 31 is referred to as the light-outgoing end portion of the multi-mode optical fiber 30.

Any one of a step-index optical fiber, a grated-index optical fiber, and a composite optical fiber can be used as the multi-mode optical fiber 30 and the optical fiber 31. For example, the step-index optical fiber made by Mitsubishi Cable Industries, Ltd. can be used. In the present embodiment, the multi-mode optical fiber 30 and the optical fiber 31 are a step-index optical fiber. In the multi-mode optical fiber 30, the clad diameter is 125 µm, the core diameter is 25 µm, NA is 0.2 and the transmittance of an incident end face coat is not lower than 99.5%. In the optical fiber 31, the clad diameter is 60 µm, the core diameter is 25 µm, and NA is 0.2.

Figure 10:
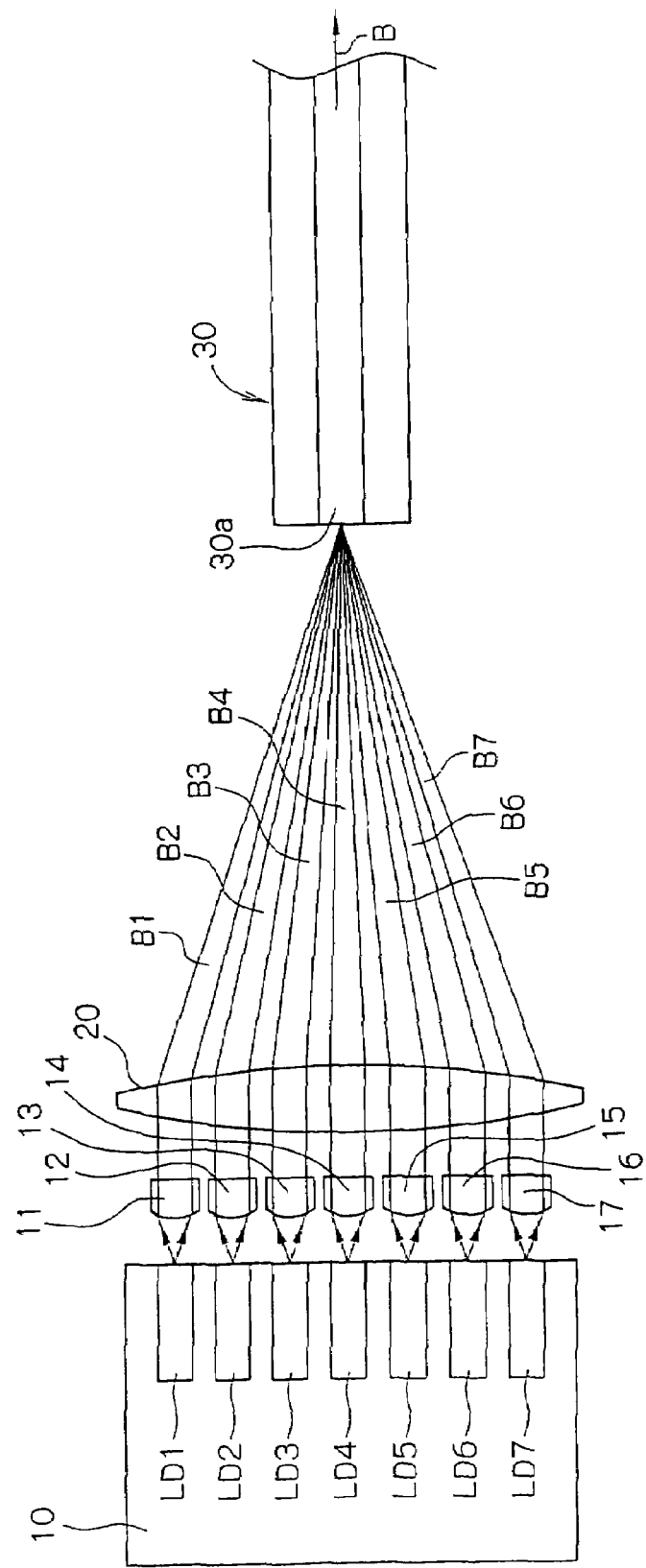
FIG. 10 is a plan view showing the configuration of a multiplexing laser light source.

The laser module 64 includes a multiplex laser light source (fiber light source) shown in FIG. 10. The multiplex laser light source includes plural (for example, seven) lateral multi-mode or single-mode tip semiconductor lasers LD1, LD2, LD3, LD4, LD5, LD6, and LD7 which are arrayed and fixed onto a heat black 10, collimator lenses 11, 12, 13, 14, 15, 16, and 17 which are provided corresponding to each of the semiconductor lasers LD1 to LD7, a condenser lens 20, and one multi-mode optical fiber 30. The number of the semiconductor lasers is not limited to seven. For example, it is possible that the 20 laser beams of the semiconductor laser are incident to the multi-mode optical fiber in which the clad diameter is 60 µm, the core diameter is 50 µm, and NA is 0.2. The number of optical fibers can be decreased as well as realizing the light quantity that required for the irradiation head.

Figure 11:
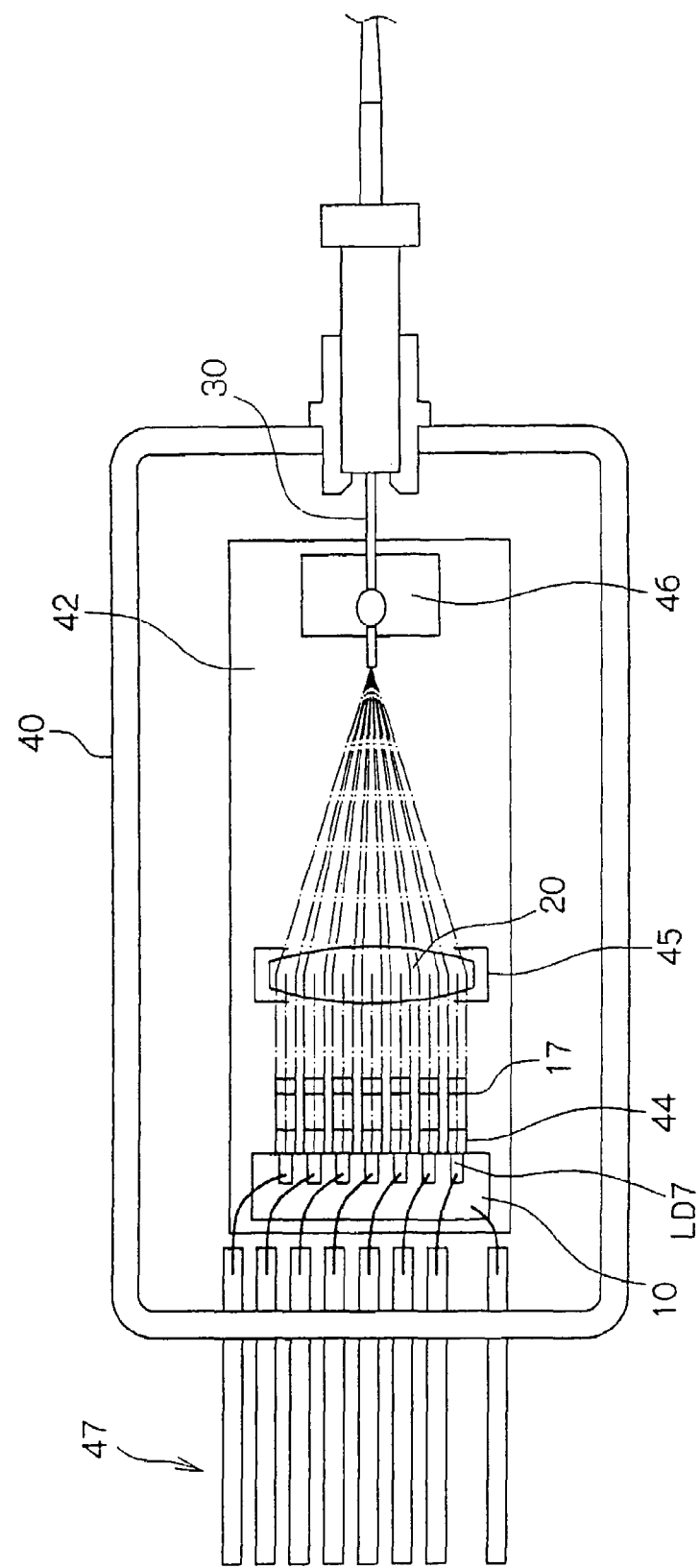
FIG. 11 is a plan view showing the configuration of a laser module.
Figure 12:
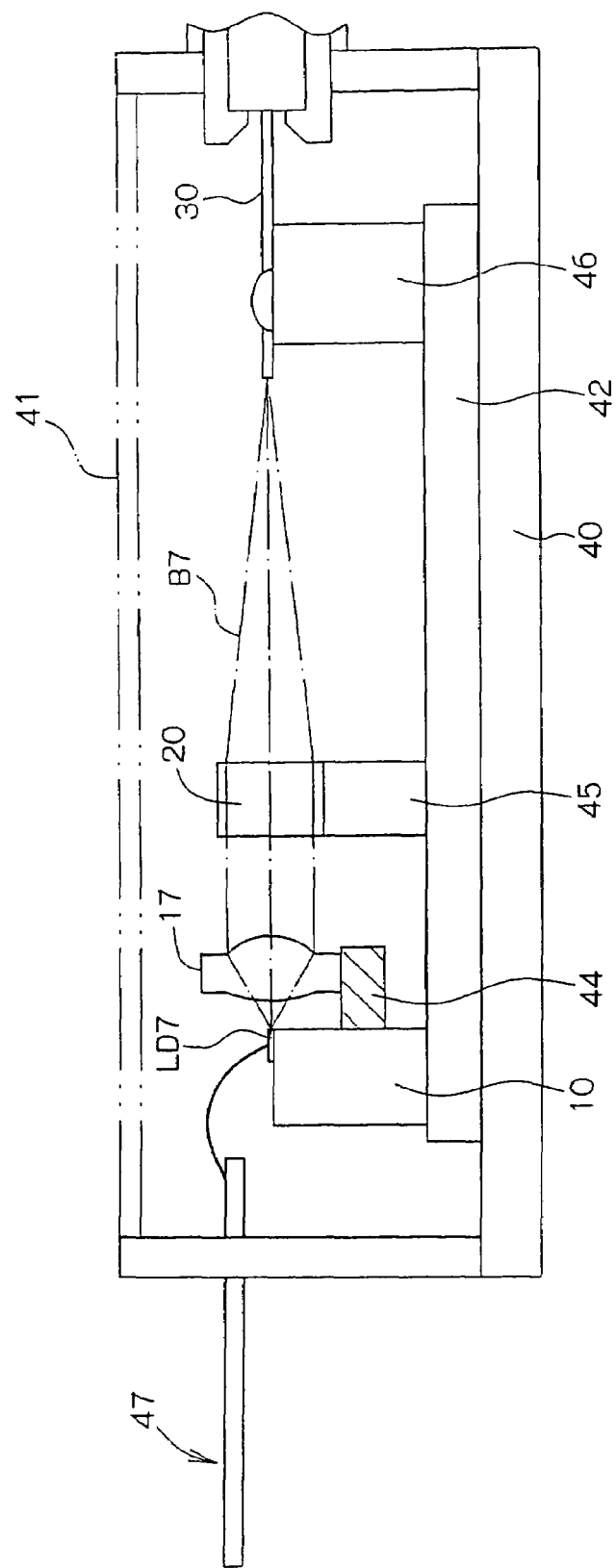
FIG. 12 is a side view showing the configuration of the laser module shown in FIG. 11.

For example, as shown in FIGS. 11 and 12, the above multiplex laser light source and other optical elements are stored in a box-formed package 40 which has an opening at the top thereof. The package 40 includes a package lid 41, which is formed so as to close the opening of the package 40. The multiplex laser light source is hermetically sealed in a closed space (sealed space) formed by the package 40 and the package lid 41 in such a manner that sealing gas is introduced after deaeration process is performed and the opening of the package 40 is closed by the package lid 41.

A base plate 42 is fixed to a bottom of the package 40. A heat block 10, a condenser lens holder 45 which holds the condenser lens 20, a fiber holder 46 which holds the incident end portion of the multi-mode optical fiber 30 are fitted to an upper surface of the base plate 42. The light-outgoing end portion of the multi-mode optical fiber 30 is extracted outside the package from the opening formed in a wall surface of the package 40.

A collimator lens holder 44 is fitted to a side face of the heat block 10, and the collimator lenses 11 to 17 are held in the collimator lens holder 44. The opening is formed in a side wall surface of the package 40, and a wiring 47 for supplying driving current to the semiconductor lasers LD1 to LD7 is extracted outside the package through the opening.

In FIG. 12 in order to avoid complication of the figure, only the semiconductor laser LD7 is numbered in the plural semiconductor lasers, and only the collimator lens 17 is numbered in the plural collimator lenses.

Figure 13:
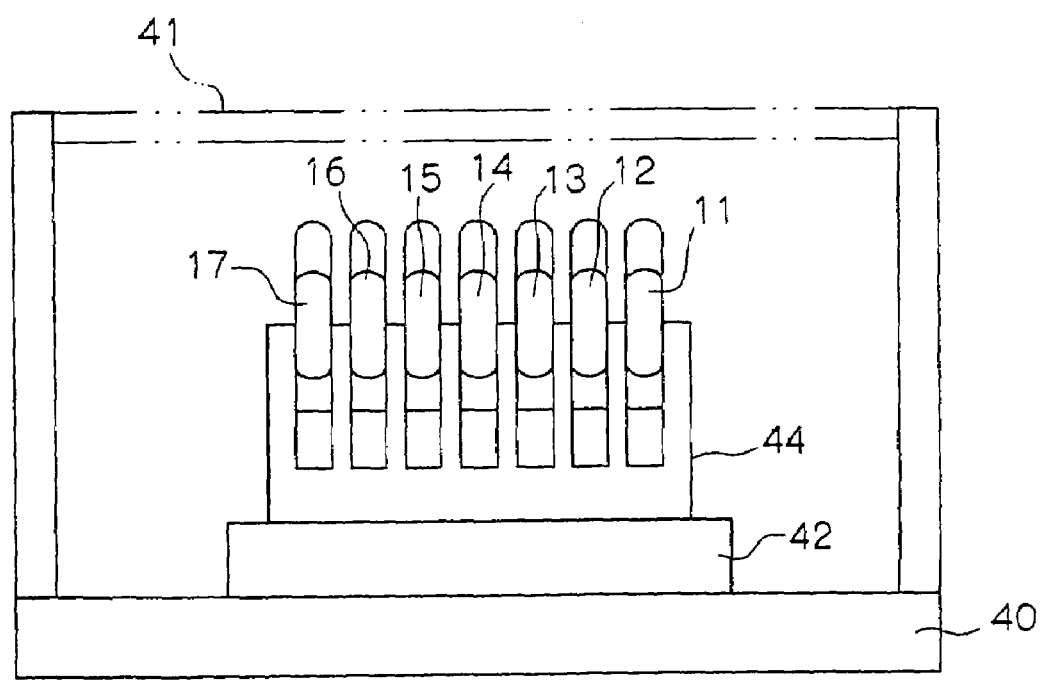
FIG. 13 is a partially side view showing the configuration of the laser module shown in FIG. 12.

FIG. 13 shows a front view of apart to which the collimator lenses 11 to 17 are fitted. Each of the collimator lenses 11 to 17 is formed in the elongated shape in which the area including the optical axis of a circular lens having an aspheric surface is cut by parallel planes. The elongated-shaped collimator lens can be formed by molding resin or optical glass, for example. The collimator lenses 11 to 17 are disposed closely in the array direction of the light-emission points of the semiconductor lasers LD1 to LD7 so that a length direction of the collimator lenses 11 to 17 is orthogonal to the array direction of the light-emission points (right and left direction in FIG. 13).

On the other hand, as the semiconductor lasers LD1 to LD7, the laser is used, which includes an active layer whose light-emission width is 2 µm and emits the laser beams B1 to B7 while a spread angle in a direction parallel to the active layer is 10° and a spread angle in the direction orthogonal to the active layer is 30°. The semiconductor lasers LD1 to LD7 are provided so that the light-emission points are arranged in line in the direction parallel to the active layer.

The laser beams B1 to B7 emitted from each light-emission point are incident while the direction in which the spread angle is larger corresponds to the length direction of the elongated-shaped collimator lenses 11 to 17 and the direction in which the spread angle is smaller corresponds to the width direction (the direction orthogonal to the length direction) of the elongated-shaped collimator lenses 11 to 17. That is to say, the width of each of the collimator lenses 11 to 17 is 1.1 mm, the length thereof is 4.6 mm, the beam diameter in the horizontal direction of the laser beams B1 to B7 incident to the collimator lenses 11 to 17 is 0.9 mm, and the beam diameter in the vertical direction is 2.6 mm. In each of the collimator lenses 11 to 17, a focal distance $f_1$ is 3 mm, NA is 0.6, and a lens arrangement pitch is 1.25 mm.

The condenser lens 20 is formed in the elongated shape in which the area including the optical axis of a circular lens having an aspheric surface is cut by the parallel planes so that the condenser lens is longer in the array direction of the collimator lenses 11 to 17, that is, in the horizontal direction, and is shorter in the direction orthogonal to the horizontal direction. In the condenser lens 20, a focal distance $f_2$ is 23 mm and NA is 0.2. The condenser lens 20 is also formed by molding resin or optical glass.

In the fiber array light source 300A having the above configuration, each of the laser beams B1 to B7 is emitted from each of the semiconductor lasers LD1 to LD7 constituting the multiplex laser light source while the laser beams B1 to B7 are a diverging ray, and the laser beams B1 to B7 are caused to be parallel to one another by the corresponding collimator lenses 11 to 17. The parallel laser beams B1 to B7 are condensed by the condenser lens 20 and focused on the incident end face of the core 30a of the multi-mode optical fiber 30.

The condenser optical system includes the collimator lenses 11 to 17 and the condenser lens 20 as mentioned above, and the multiplex optical system includes the condenser optical system and the multi-mode optical fiber 30. That is to say, the laser beams B1 to B7 condensed by the condenser lens 20 are incident to the core 30a of the multi-mode optical fiber 30 to propagate through the optical fiber. Then, the laser beams B1 to B7 are multiplexed into one laser beam B to be outputted from the optical fiber 31 connected to the outgoing end portion of the multi-mode optical fiber 30.

In each laser module, for example, in the case where coupling efficiency of the laser beams B1 to B7 to the multi-mode optical fiber 30 is 0.85 and the each output of the semiconductor lasers LD1 to LD7 is 30 mW (in the case of using the single-mode laser), the multiplexed laser beam B having the output of 180 mW (=30 mW×0.85×7) can be obtained for each of the arrayed optical fibers 31. Accordingly, the output is about 18 W (=180 mW×100) at the laser-outgoing unit 68 where the 100 optical fibers 31 are arrayed.

In the laser-outgoing unit 68 of the fiber array light source 300A, the light-emission points having high luminance are arrayed in line along the main scanning direction. In the conventional fiber light source in which the laser beam emitted from the single semiconductor laser is connected to one optical fiber, since the output is low, the desired output can be obtained only when the many columns of the semiconductor lasers are arrayed. However, the multiplex laser light source used in the embodiment has the high output, so that a few columns can obtain the desired output, for example, one column of the semiconductor lasers.

For example, in the conventional fiber light source in which the semiconductor laser and the optical fiber are connected to each other one-to-one, the laser having the output of about 30 mW is usually used as the semiconductor laser, and the multi-mode optical fiber is used as the optical fiber. In the multi-mode optical fiber, the core diameter is 50 µm, the clad diameter is 125 µm, and NA is 0.2. When the output of about 18 W is obtained, it is necessary to bundle the 864 (8×108) multi-mode optical fibers. Since an area of light-emission is 13.5 mm² (1 mm×13.5 mm), the luminance at the laser-outgoing unit 68 is 1.3 (MW/m²) and the luminance per one optical fiber is 8 (MW/m²).

On the other hand, in the embodiment, as described above, since the output of about 18 W can be obtained by the 100 multi-mode optical fibers and the area of light-emission at the laser-outgoing unit 68 is 0.3125 mm² (0.025 mm×12.5 mm), the luminance at the laser-outgoing unit 68 is 57.6 (MW/m²) and the luminance can be increased about 44 times compared with the conventional fiber light source. Further, the luminance per one optical fiber is 288 (MW/m²) and the luminance can be increased about 36 times compared with the conventional fiber light source.

The configuration of the laser direction reversed irradiation mechanism of the laser annealing apparatus shown in FIG. 19 will be described below.

Figure 19:
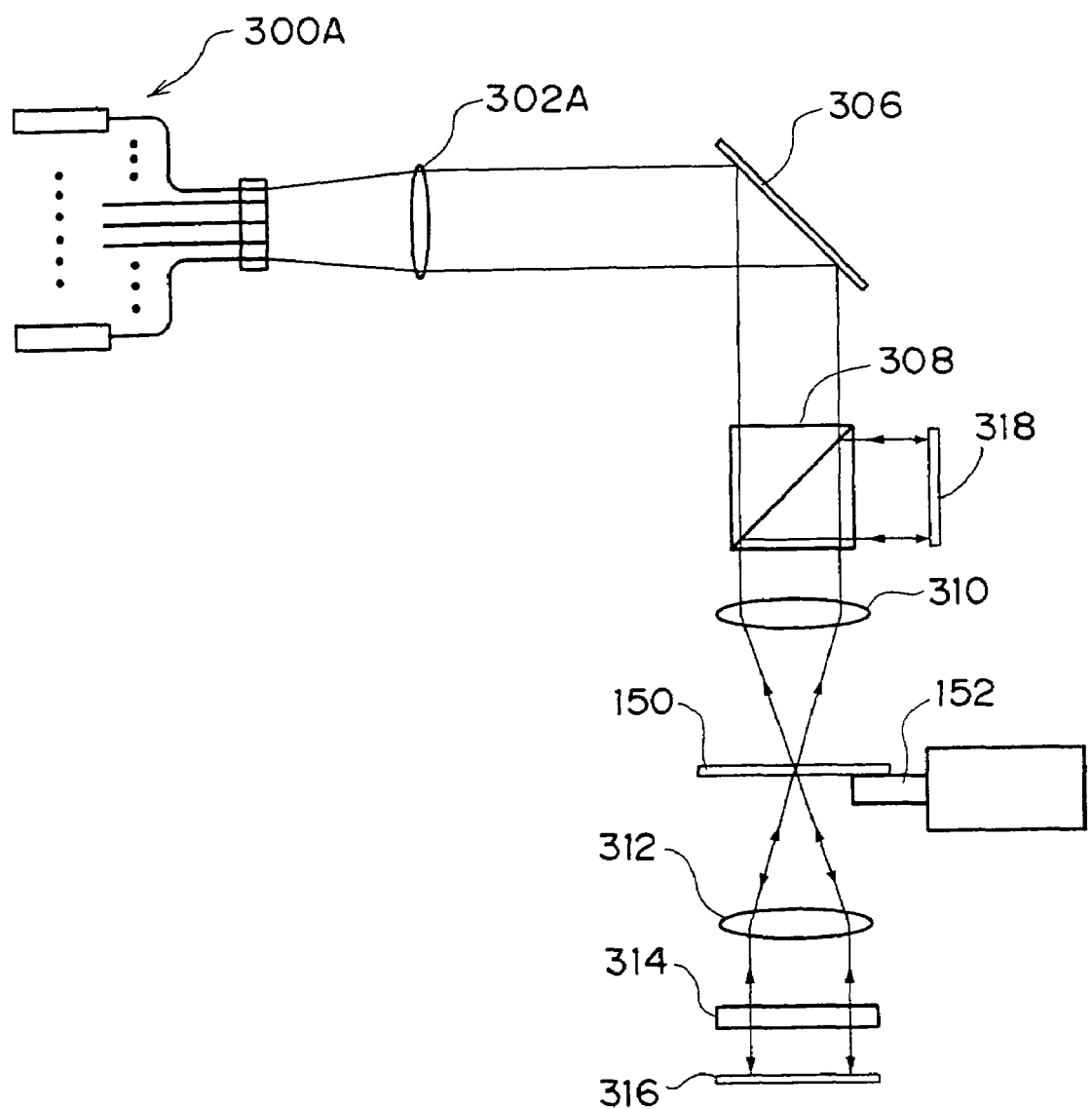
FIG. 19 shows the optical path for annealing process in which the fiber array light source is used and DMD is removed, in the laser annealing apparatus according to the embodiment of the invention.

The laser direction reversed irradiation mechanism shown in FIG. 19 is configured by using fiber array light source 300A as the laser light source 300 and utilizing a beam forming optical system 302A which forms the laser beam emitted from a laser emission unit arrayed in line along the main scanning direction orthogonal to the sub scanning direction into the light beam having the desired beam intensity.

Further, the laser direction reversed irradiation mechanism shown in FIG. 19 is configured so that the spatial light modulator (DMD) 304 is removed and each semiconductor laser is driven and controlled in the fiber array light source 300A. The laser direction reversed irradiation mechanism shown in FIG. 19 is intended to act similar to the laser direction reversed irradiation mechanism in which the spatial light modulator (DMD) 304 is provided. Other configurations are the same as the laser direction reversed irradiation mechanism shown in FIG. 2.

The configuration of the laser direction reversed irradiation mechanism of the laser annealing apparatus shown in FIG. 20 will be described below.

Figure 20:
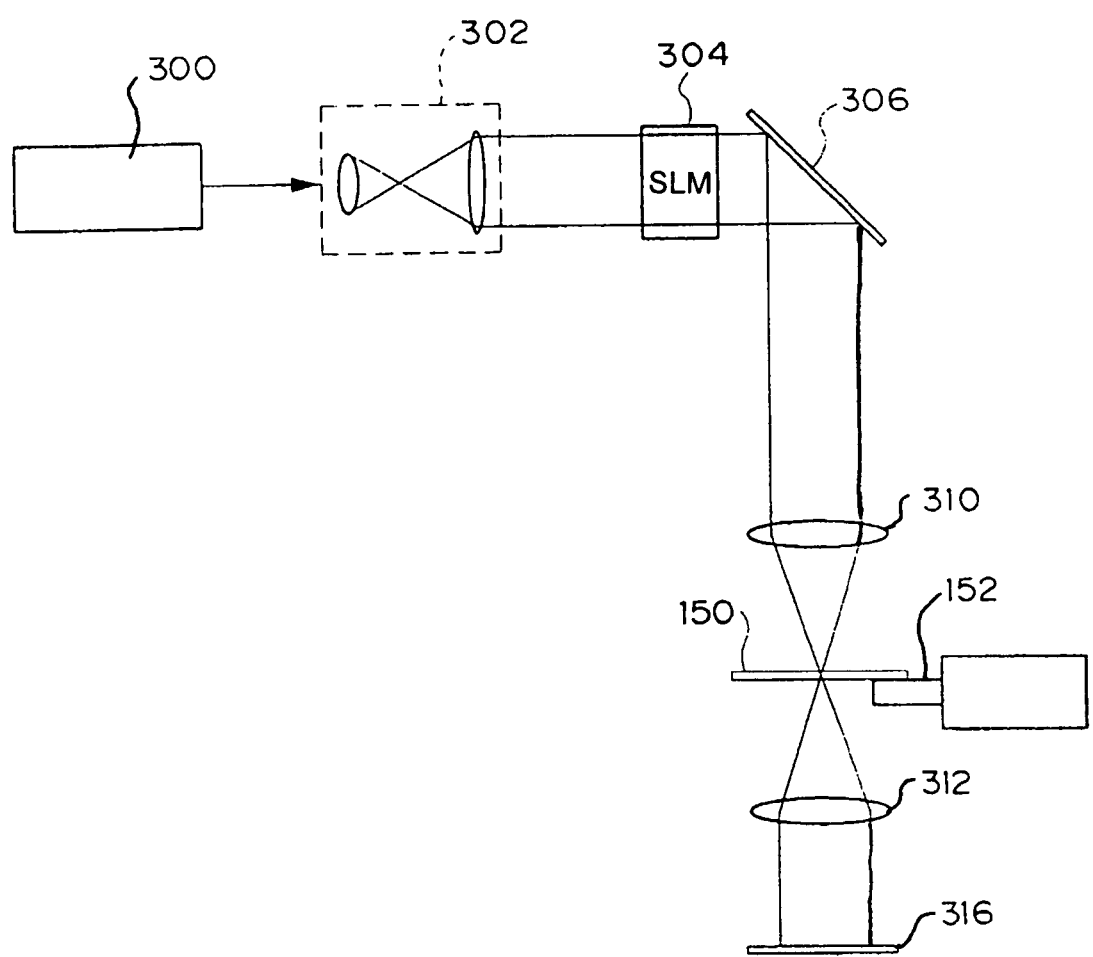
FIG. 20 shows the optical path for annealing process in which the laser beam goes and returns one time, in the laser annealing apparatus according to the embodiment of the invention.

The laser direction reversed irradiation mechanism shown in FIG. 20 is configured so that the laser beam travels back and forth the surface of the substrate (transmitted twice). Therefore, in the laser direction reversed irradiation mechanism shown in FIG. 2, the polarization beam splitter 308, the quarter-wave plate 314, and the mirror 318 are removed, and other configurations are the same as the laser direction reversed irradiation mechanism shown in FIG. 2.

It is preferable that the laser direction reversed irradiation mechanism shown in FIG. 20 having the above configuration is used under conditions, such as the film thickness and the wavelength of the laser beam, in which the light energy is sufficiently absorbed in the a-Si film, when the laser beam travels back and forth the surfaces of the substrate only once. The configuration can be simplified and manufactured at low cost.

The configuration of the laser direction reversed irradiation mechanism of the laser annealing apparatus shown in FIG. 21 will be described below.

The laser direction reversed irradiation mechanism shown in FIG. 21 is configured so that the laser annealing is performed by using the light beam of 405 nm of the GaN semiconductor laser in the case where the a-Si film on the substrate 150 has the film thickness in a range of 10 nm to 15 nm. Therefore, the laser light source 300 in the laser direction reversed irradiation mechanism shown in FIG. 2 is configured as the GaN semiconductor laser light source. Other configurations are the same as the laser direction reversed irradiation mechanism shown in FIG. 2.

In the laser direction reversed irradiation mechanism shown in FIG. 21 having the above configuration, even if the absorption rate of the thin a-Si film having the film thickness of about 10 nm to the light beam of 405 nm of the GaN semiconductor laser is as low as 20% as shown in FIG. 3 when the light beam of 405 nm of the GaN semiconductor laser is transmitted through the thin a-Si film one time, the absorption rate can be improved to about 80% or more in such a manner that the laser beam travels back and forth the surfaces of the substrate twice (transmitted four times).

The upper oscillation limit of the laser wavelength λ of the GaN semiconductor laser is not more than 460 nm. When the laser wavelength λ becomes an ultraviolet region whose wavelength is less than 400 nm, the photodecomposition is increased. When dust adhering to the mirror or the lens is irradiated with the laser beam of the ultraviolet legion, there is a possibility that the photodecomposition of the dust adhering to the mirror or the lens is generated to contaminate the mirror or the lens. Therefore, when the wavelength λ of the GaN semiconductor laser is set to the range not lower than 400 nm, the contamination of the mirror and the lens can be effectively prevented.

The configuration of the laser direction reversed irradiation mechanism of the laser annealing apparatus shown in FIG. 22 will be described below.

Figure 22:
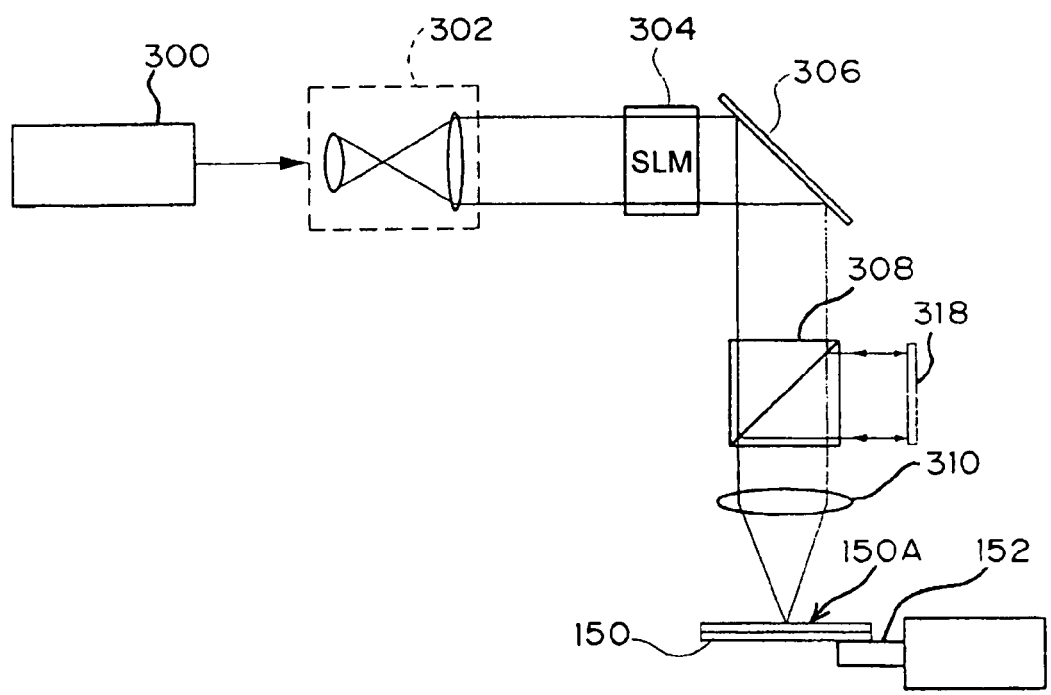
FIG. 22 shows the optical path, in which a substrate in which an optical device is integrally formed is annealed, in the laser annealing apparatus according to the embodiment of the invention.

In the laser direction reversed irradiation mechanism shown in FIG. 22, the laser beam is emitted from the surface side of the a-Si film (laser irradiation side for a first time) and transmitted through the a-Si film. Then, the laser beam is converted into a linearly polarized laser beam orthogonal to the laser beam, and a direction of the laser beam is reversed along one optical path to irradiate the a-Si film from the backside of the a-Si film. Accordingly, the optical device having both the quarter-wave plate function and the reflecting function is integrally formed into the substrate 150 on which the a-Si film is provided is utilized. That is to say, the optical device is configured so as to have both the reflecting function, in which the incident laser beam is reflected so that a direction of the laser beam is reversed along the one optical path, and the function of forming the polarized light orthogonal to the incident polarized light.

Figure 23:
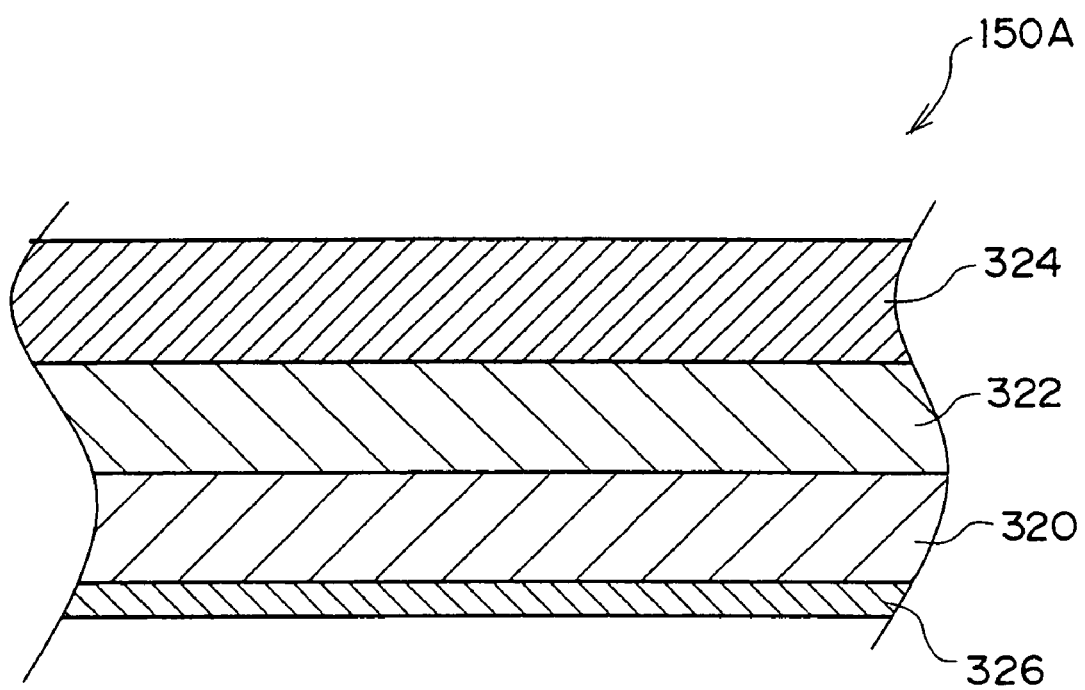
FIG. 23 is an expanded sectional view of a main part illustrating the substrate in which the optical device is integrally formed, which is used in the laser annealing apparatus according to the embodiment of the invention.

Therefore, as shown in FIG. 23, a substrate 150A in which the optical device is integrally formed can be configured in such a manner that a buffer layer 322 is formed on the upper surface of a glass substrate 320, an a-Si layer 324 is formed on the buffer layer 322, and a reflecting film 326 is formed on the lower surface of the glass substrate 320.

The buffer layer 322 is formed as so to have the function of the quarter-wave plate 314. In the buffer layer 322, the film made of $SiO_2$ having the thickness of the quarter-wave plate is formed, such that the film is formed so that the thickness of the buffer layer 322×refractive index=λ/4.

The reflecting film 326 is made of silver or, is formed by the multi-layered film (multi-layered reflecting film of $SiO_2$ and $TiO_2$).

Figure 24:
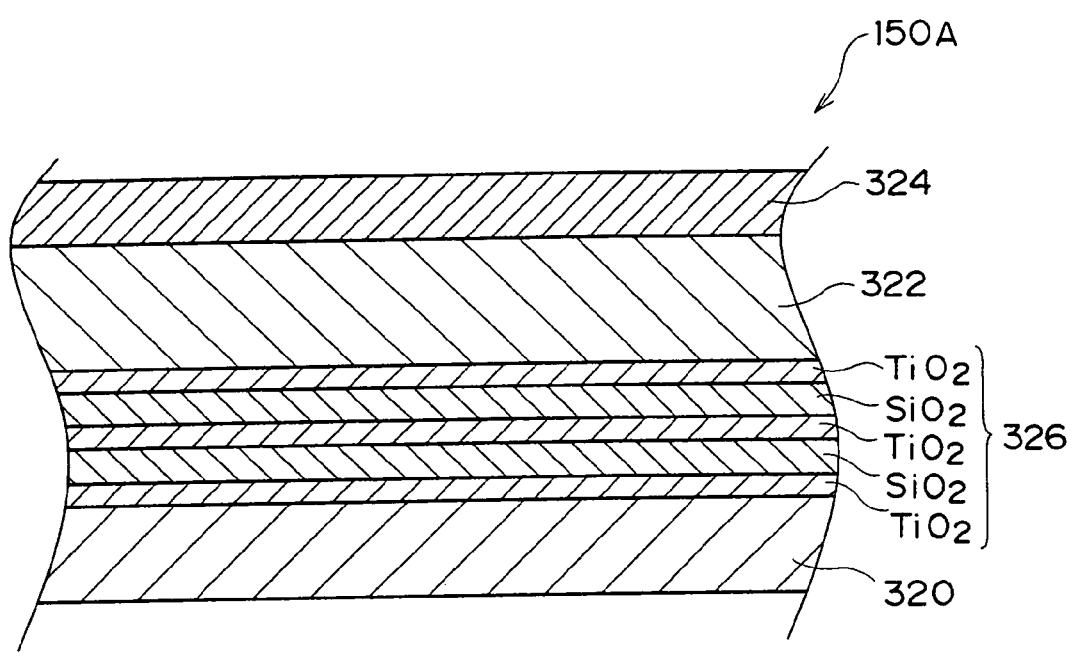
FIG. 24 is an expanded sectional view of a main part showing another configuration of the substrate in which the optical device is integrally formed, which is used in the laser annealing apparatus according to the embodiment of the invention.

As shown in FIG. 24, the substrate 150A in which the optical device is integrally formed can be configured in such a manner that the reflecting film 326 which is of the multi-layered reflecting film of $SiO_2$ and $TiO_2$ is formed on the upper surface of a glass substrate 320, the buffer layer 322 is formed on the reflecting film 326, and the a-Si layer 324 is further formed on the buffer layer 322.

As described above, in the laser direction reversed irradiation mechanism shown in FIG. 22 in which the substrate 150A and the optical device having both the quarter-wave plate function and the reflecting function are combined and used, compared with the laser direction reversed irradiation mechanism shown in FIG. 2, since the lens 312, the quarter-wave plate 314, and the lens 316 are not required, the configuration in which the lens 312, the quarter-wave plate 314, and the lens 316 are omitted can be realized. Other configurations are the same as the laser direction reversed irradiation mechanism shown in FIG. 2.

In the laser direction reversed irradiation mechanism shown in FIG. 22 in which the substrate 150A and the optical device having both the quarter-wave plate function and the reflecting function are combined and used, the buffer layer 322 functions as the quarter-wave plate 314 and the reflecting film 326 functions as the mirror 316, so that the same effects and advantages as the laser direction reversed irradiation mechanism shown in FIG. 2 can be obtained.

The configuration of the laser direction reversed irradiation mechanism of the laser annealing apparatus shown in FIG. 25 will be described below.

Figure 25:
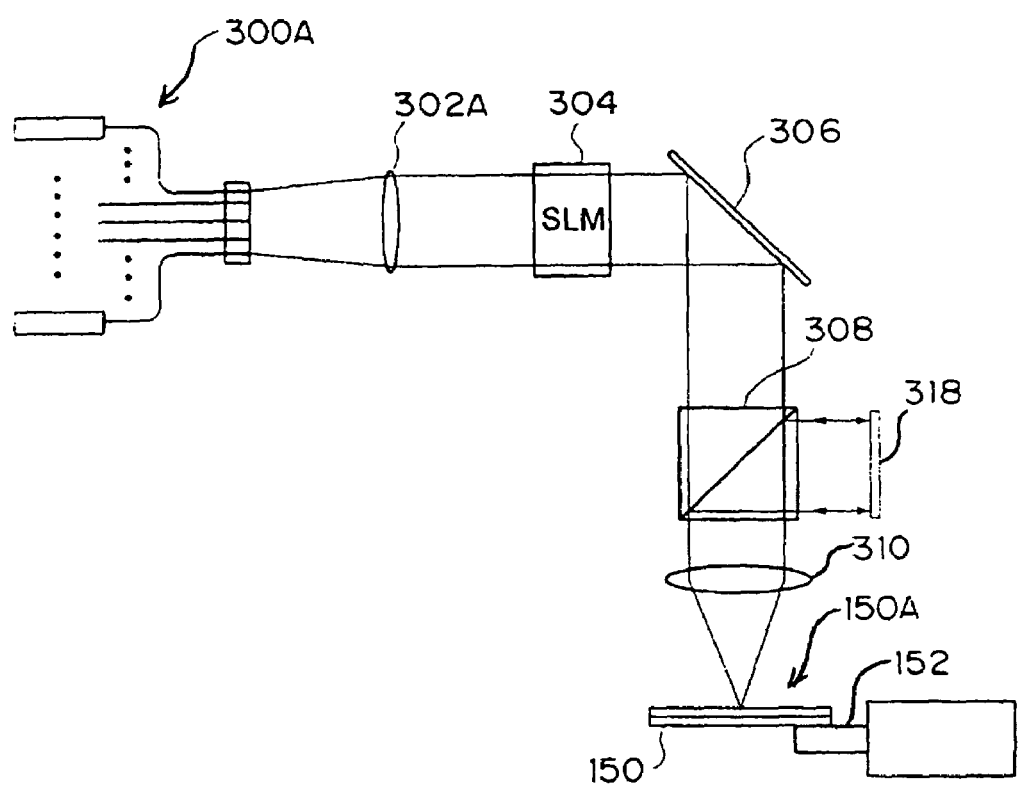
FIG. 25 shows the optical path for annealing process, in which the substrate in which the optical device is integrally formed is annealed by utilizing the fiber array light source, in the laser annealing apparatus according to the embodiment of the invention.

The configuration shown in FIG. 18 in which the fiber array light source 300A is used as the laser light source 300 and the beam forming optical system 302A which forms the laser beam emitted from a laser emission unit arrayed in line along the main scanning direction orthogonal to the sub scanning direction into the light beam having the desired beam intensity is utilized, and the configuration of the substrate 150A in which the optical device having both the quarter-wave plate function and the reflecting function is integrally formed, are combined in the configuration of the laser direction reversed irradiation mechanism shown in FIG. 25. Other configurations are the same as the laser direction reversed irradiation mechanism shown in FIG. 2.

The configuration of the laser direction reversed irradiation mechanism of the laser annealing apparatus shown in FIG. 26 will be described below.

Figure 26:
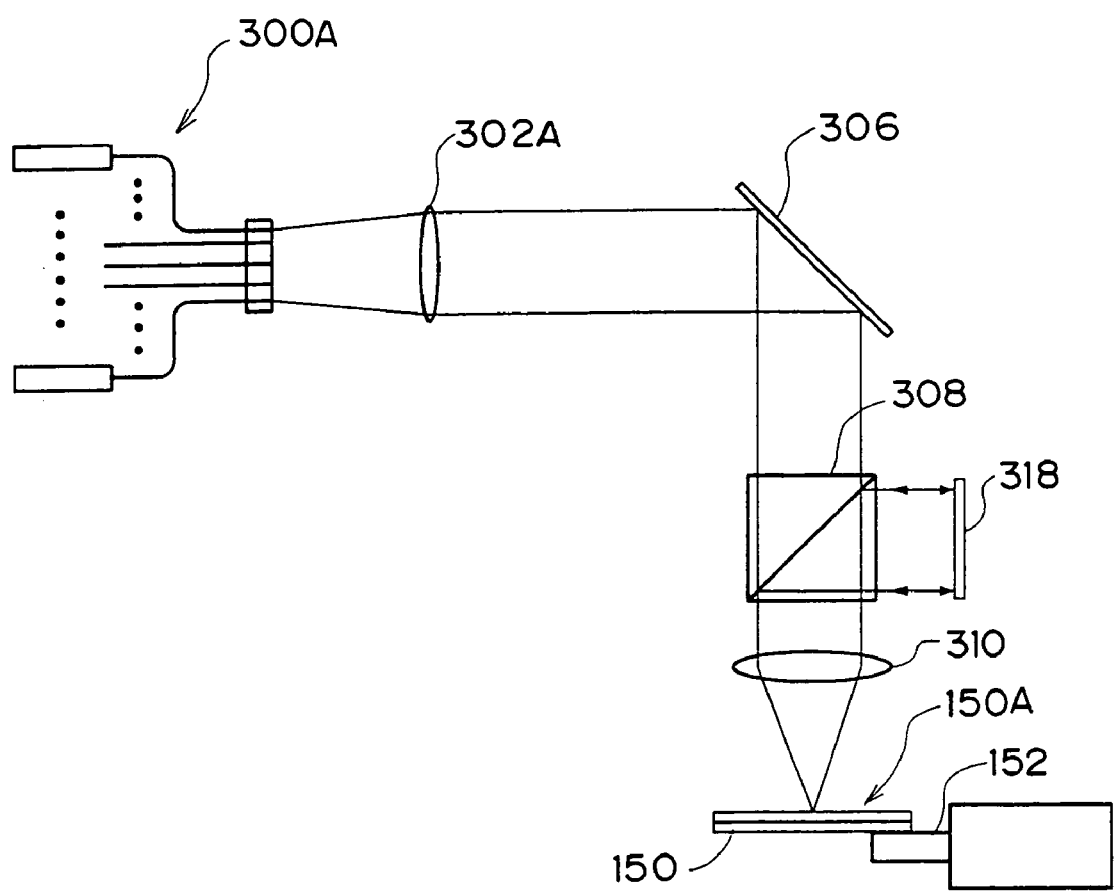
FIG. 26 shows the optical path for annealing process, in which DMD is removed and the substrate in which the optical device is integrally formed is annealed by utilizing the fiber array light source, in the laser annealing apparatus according to the embodiment of the invention.

The configuration shown in FIG. 19 in which the fiber array light source 300A is used as the laser light source 300 and the beam forming optical system 302A which forms the laser beam emitted from a laser emission unit arrayed in line along the main scanning direction orthogonal to the sub scanning direction into the light beam having the desired beam intensity is utilized, the configuration in which the spatial light modulator (DMD) 304 is removed and each semiconductor laser is driven and controlled in the fiber array light source 300A, and the configuration of the substrate 150A in which the optical device having both the quarter-wave plate function and the reflecting function is integrally formed, are combined in the configuration of the laser direction reversed irradiation mechanism shown in FIG. 26. Other configurations are the same as the laser direction reversed irradiation mechanism shown in FIG. 2.

The configuration of the laser direction reversed irradiation mechanism of the laser annealing apparatus shown in FIG. 27 will be described below.

The configuration shown in FIG. 20 in which the polarization beam splitter 308 is removed in order that the laser beam travels back and forth the surface of the substrate, and the configuration of the substrate 150A in which the optical device having the reflecting function is integrally formed (the quarter-wave plate function is removed) are combined in the configuration of the laser direction reversed irradiation mechanism shown in FIG. 27. That is to say, the configuration in which the lens 312 and the mirror 316 are removed from the configuration shown in FIG. 20, and the configuration in which the buffer layer 322 is removed from the configuration shown in FIGS. 23 and 24, are combined in the configuration of the laser direction reversed irradiation mechanism of the laser annealing apparatus shown in FIG. 27. Other configurations are the same as the laser direction reversed irradiation mechanism shown in FIG. 2. In the configuration of the laser direction reversed irradiation mechanism shown in FIG. 27, the same effects and advantages as the laser direction reversed irradiation mechanism shown in FIG. 20 can be obtained.

The configuration of the laser direction reversed irradiation mechanism of the laser annealing apparatus shown in FIG. 28 will be described below.

Figure 28:
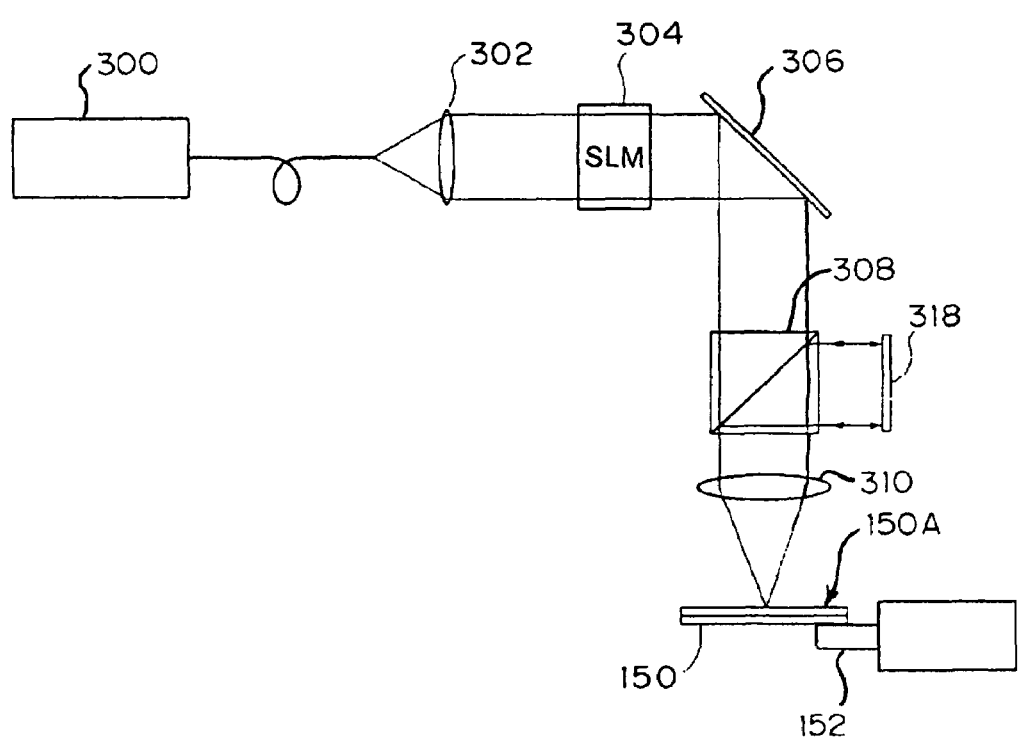
FIG. 28 shows the optical path for annealing process, in which the substrate in which the optical device is integrally formed is annealed by utilizing the light source emitting the light beam of 405 nm of the GaN semiconductor laser, in the laser annealing apparatus according to the embodiment of the invention.
Figure 29:
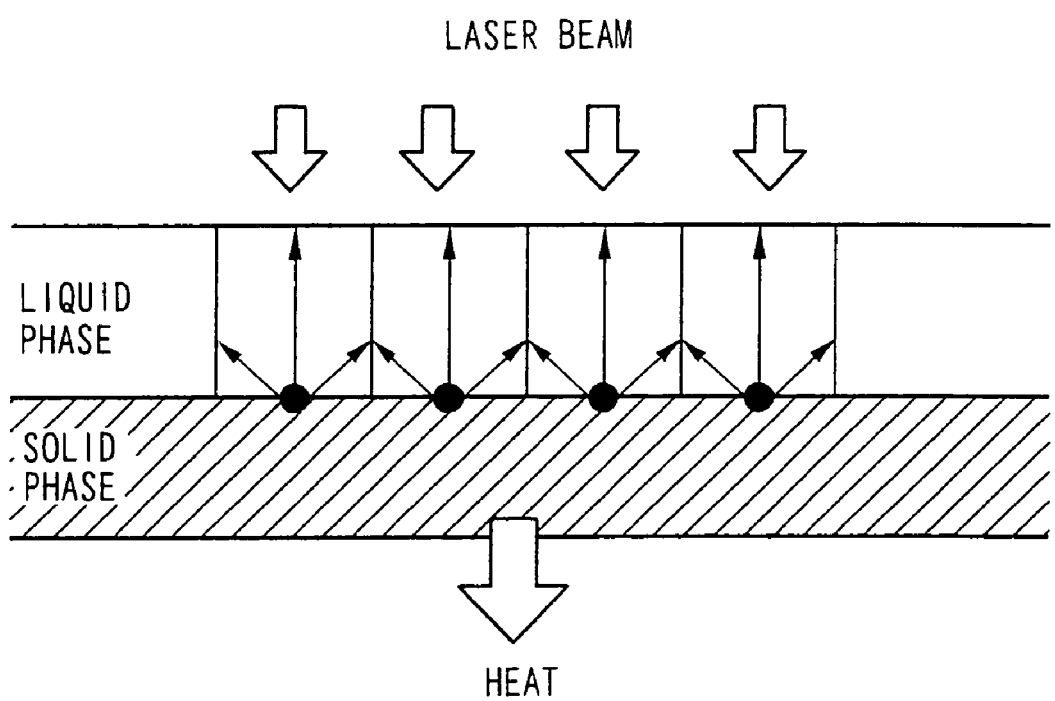
FIG. 29 is an explanatory view showing the state in which a silicon layer is partially melted by the conventional excimer laser annealing.
Figure 30:
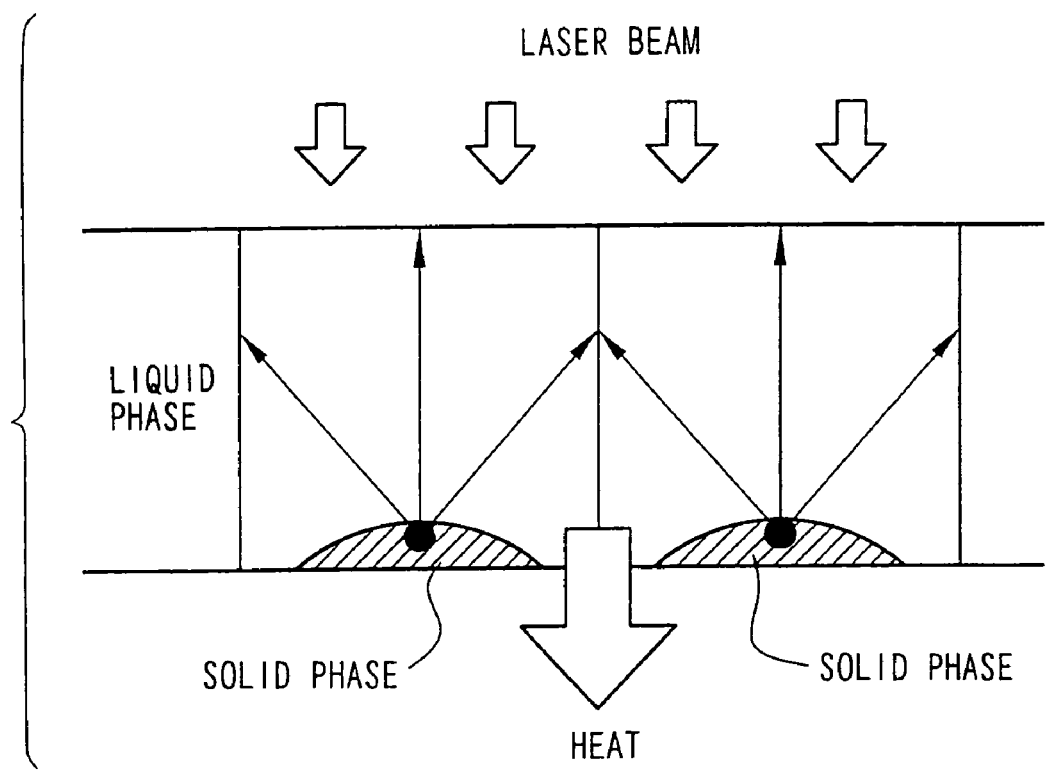
FIG. 30 is an explanatory view showing the state in which a crystal grain is grown by the conventional excimer laser annealing while a remaining a-Si phase becomes an island structure.
Figure 31:
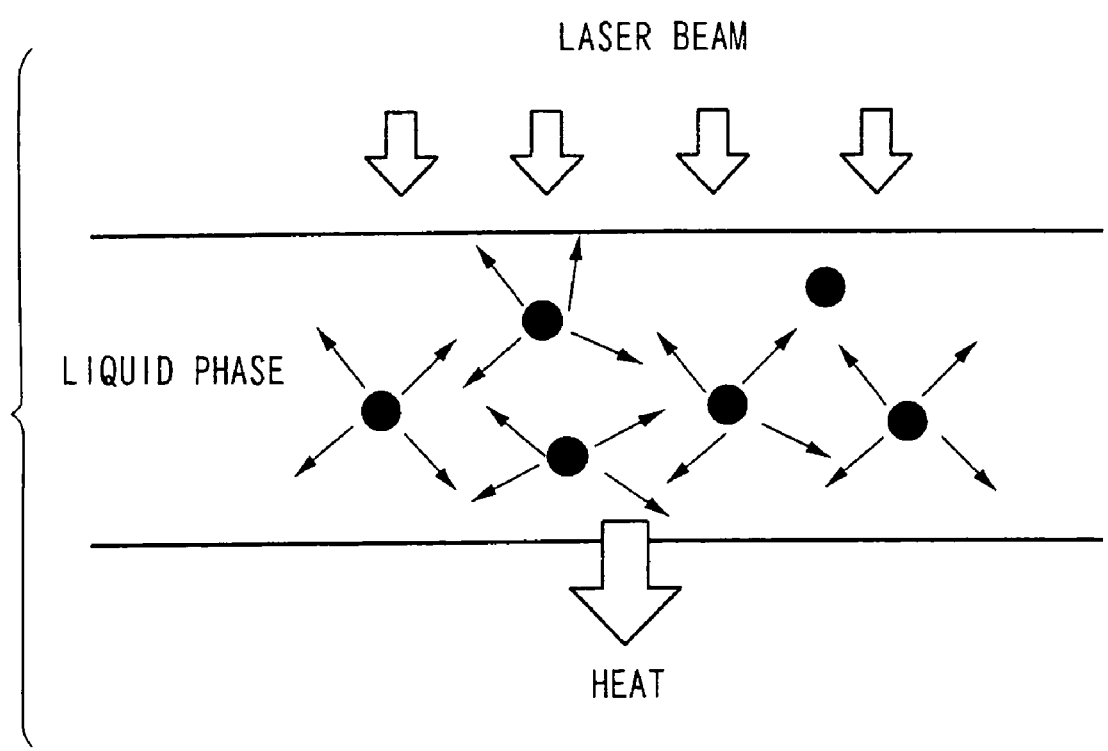
FIG. 31 is an explanatory view showing the state in which, after the a-Si phase is completely melted by the conventional excimer laser annealing, a supercooling state is formed and then the silicon layer is filled with micro-crystal grains.
Figure 32:
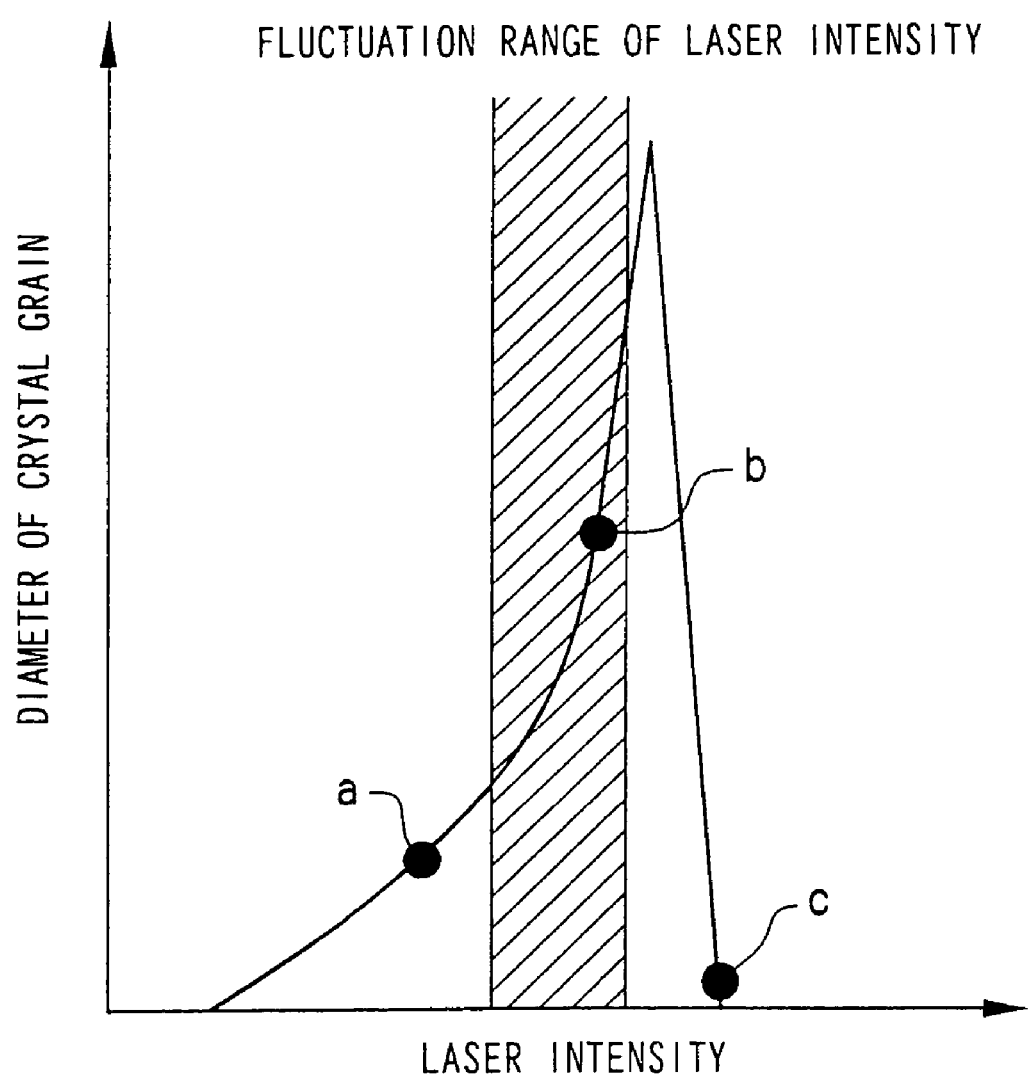
FIG. 32 is an explanatory view qualitatively showing a relationship between laser intensity and a diameter of the crystal grain in the conventional excimer laser annealing.
Figure 33:
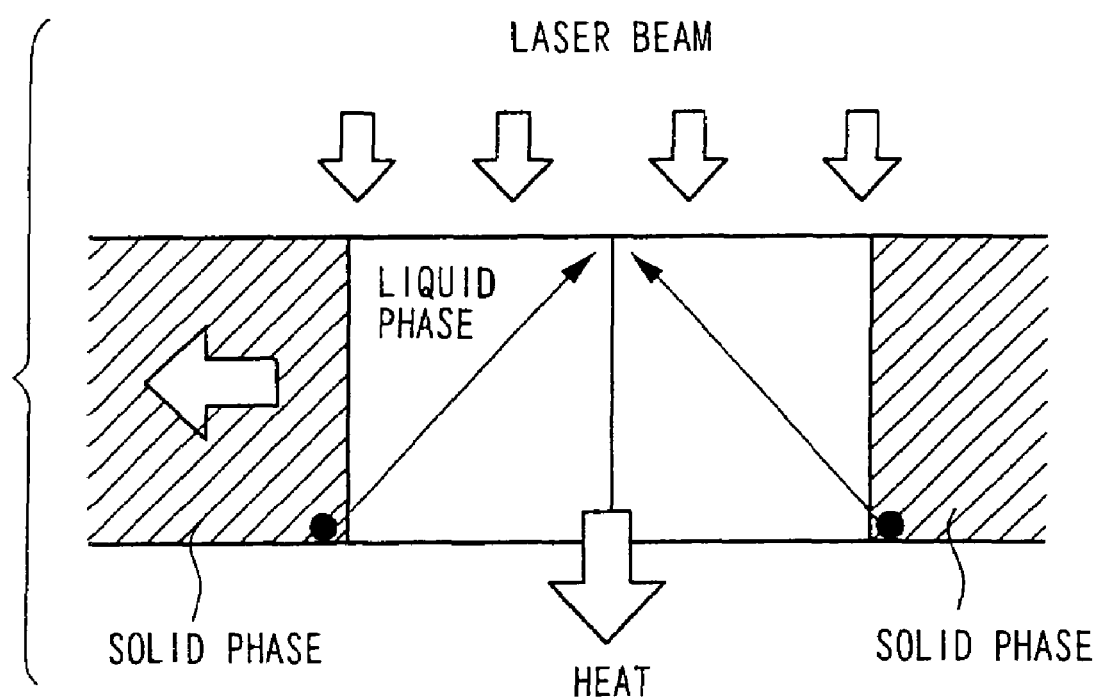
FIG. 33 is an explanatory view showing the state in which a size of a crystal grain boundary is restricted by colliding with the crystal grain from an side opposite to the film thickness in the conventional annealing method in which crystal growth is controlled in a lateral direction.
Figure 34:
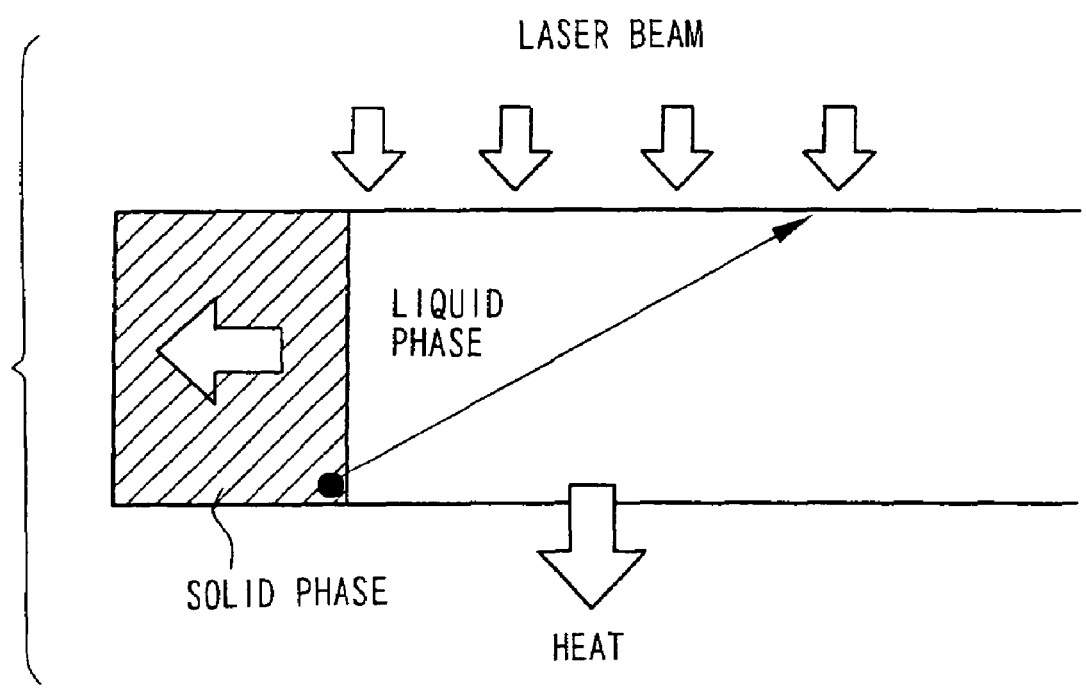
FIG. 34 is an explanatory view showing the state in which a temperature gradient in the depth direction is made flat with the light beam of 532 nm of a Nd:YVO$_4$ laser and the crystal grain boundary is largely grown in the lateral direction while a solid-liquid interface is stood vertically, in the conventional annealing method in which the crystal growth is controlled in the lateral direction.

The configuration shown in FIG. 21 in which the laser annealing is performed by using the light beam of 405 nm of the GaN semiconductor laser in the case where the a-Si film on the substrate 150 has the thin thickness in a range of 10 nm to 15 nm, and the configuration of the substrate 150A in which the optical device having both the quarter-wave plate function and the reflecting function is integrally formed are combined in the configuration of the laser direction reversed irradiation mechanism shown in FIG. 28. Other configurations are the same as the laser direction reversed irradiation mechanism shown in FIG. 2.

In the configuration of the laser direction reversed irradiation mechanism shown in FIG. 28, the same effects and advantages as the laser direction reversed irradiation mechanism shown in FIG. 21 can be obtained.

[Operation of Laser Annealing Apparatus]

The operation of the laser annealing apparatus will be described below.

As shown in FIG. 1, in the laser annealing apparatus, the stage 152 in which the substrate 150 (or the substrate 150A) is absorbed on the surface is moved at constant speed along the guides 158 from an upstream side of the gate 160 to a downstream side by the driving device (not shown). When the stage 152 passes through below the gate 160, the front end of the substrate 150 is sensed by the sensors 164 attached to the gate 160, the exposure start position is determined and the laser light source 300 is driven and controlled to start the laser annealing process.

At this point, in the laser annealing apparatus including the spatial light modulator (DMD) 304, the control signal from the mirror driving control unit is sent to the spatial light modulator (DMD) 304 to perform the on and off control of each micromirror in the spatial light modulator (DMD) 304, and the laser beam emitted from the laser light beam 300 to the spatial light modulator (DMD) 304 is reflected when the micromirrors are in the on-state. As a result, the image is formed on the a-Si film of the substrate 150 to perform the laser annealing process. Thus, the laser beam outgoing from the laser light source 300 is turned on and off in each pixel, and the substrate 150 is irradiated and annealed in each of the pixel unit (irradiation area) having substantially the same number as the number of pixels used by the spatial light modulator (DMD) 304.

Figure 16A:
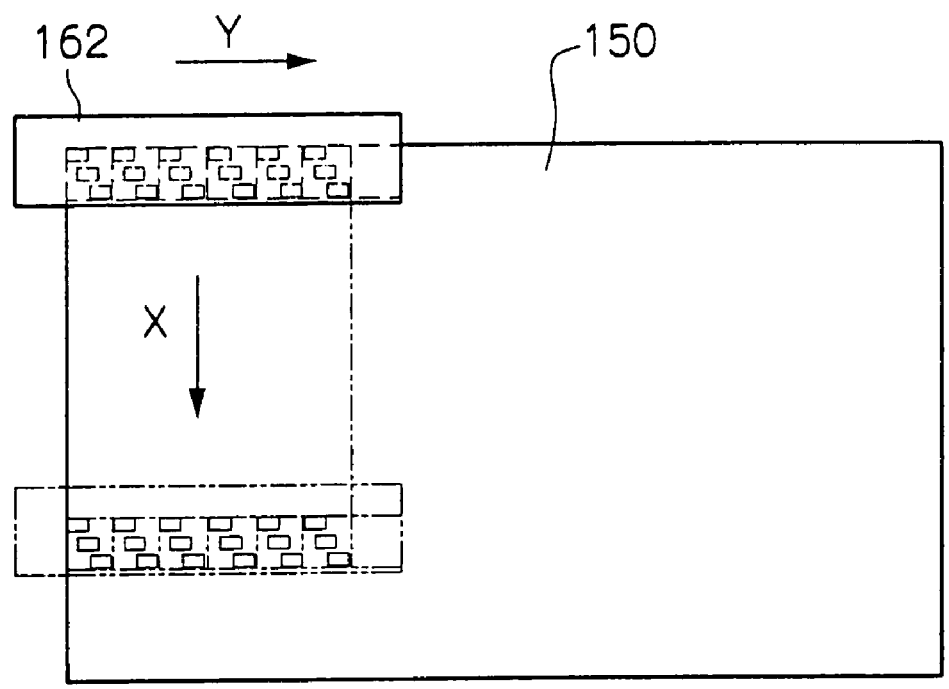
FIG. 16A is a plan view for explaining the annealing method in which the transparent substrate is annealed by plural-time scanning of the scanner.
Figure 16B:
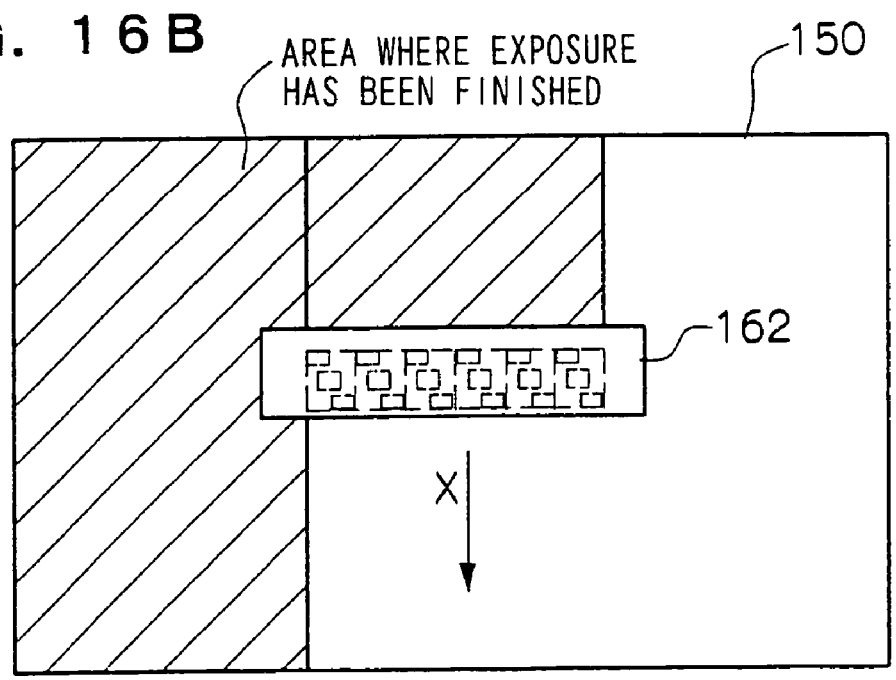
FIG. 16B is a plan view for explaining the annealing method in which the transparent substrate is annealed by plural-time scanning of the scanner.

In the laser annealing apparatus, the sub-scan of the substrate 150 is performed in the direction opposite to the stage moving direction by moving the substrate 150 and the stage 152 at constant speed, and the belt-shaped irradiated areas are formed by the scanner 162 as shown in FIGS. 15 and 16.

In the laser annealing apparatus including the spatial light modulator (DMD) 304, as shown in FIGS. 14A and 14B, for example in the case where the spatial light modulator (DMD) 304 is configured so that the 600 sets of micromirror columns, in which the 800 micromirrors are arrayed in the main scanning direction, are arrayed in the sub scanning direction, it is possible to control the spatial light modulator (DMD) 304 by the controller so that only a part of micromirror columns (for example, 800 pieces×10 columns) is driven.

As shown in FIG. 14A, it is also possible to use the micromirror columns arranged in the central portion of the spatial light modulator (DMD) 304. As shown in FIG. 14B, it is also possible to use the micromirror columns arranged in the end portion of the spatial light modulator (DMD) 304. In the case where defect is generated in a part of micromirrors, the micromirror columns can be properly changed according to the situation such that the micromirror columns in which the defect is not generated are used.

There is a limitation of data processing speed of the spatial light modulator (DMD) 304, and modulation speed per one line is determined in proportion to the number of pixels used, so that using only a part of micromirror columns increases the modulation speed per one line.

In the laser annealing apparatus, when the sub-scan of the substrate 150 performed by the scanner 162 is finished and the back end of the substrate 150 is sensed by the sensor 164, the stage 152 returns to an origin which is located on the most upstream side of the gate 160 along the guides 158 by the driving device (not shown), and the stage 152 is moved again at constant speed along the guides 158 from an upstream side of the gate 160 to a downstream side.

The laser annealing apparatus has the following five advantages, because the high-quality semiconductor laser is used as the laser light source instead of the excimer laser.

1. The output of the light beam is stabilized, and the polysilicon film in which the diameters of the crystal grains are uniform can be reproducibly manufactured.

2. Since the semiconductor laser is the solid-state laser, the semiconductor laser has high reliability in which the semiconductor laser can be driven for several tens thousands hours. In the semiconductor laser, it is difficult that breakage of the light beam outgoing end face occurs, and high peak power can be realized.

3. Compared with the case, in which the excimer laser, which is of a gas laser, is used, miniaturization can be realized and the maintenance becomes very simple. Further, energy efficiency is high as 10% to 20%.

4. Since the semiconductor laser is the laser in which CW (continuous) drive can be basically performed, even if pulse drive of the semiconductor laser is performed, the amount of absorption of amorphous silicon, repeated frequency according to a heat value, and a pulse width (duty) can be freely set. For example, an arbitrary repeated operation in a range of several Hz to several MHz can be realized and an arbitrary pulse width in a range of several psec to several hundreds msec can be realized. Particularly, the repeated frequency can be set up to the range of several tens MHz. Similarly to the CW drive, the continuous crystal grain boundary can be formed. Further, since the repeated frequency can become large, the high-speed annealing can be performed.

5. Since the CW drive of the semiconductor laser can be performed to scan the annealing surface in a predetermined direction with the continuous laser beam, orientation of the crystal growth can be controlled and the continuous crystal grain boundary can be formed, and the polysilicon film having the high carrier mobility can be formed.

The laser annealing apparatus has the following three advantages, when the fiber array light source 300A in which the outgoing end faces of the optical fibers of the multiplex laser light source are arrayed is used as the laser light source in the laser annealing apparatus.

1. Usually in the laser annealing apparatus, high light density in a range of 400 mJ/cm$^2$ to 700 mJ/cm$^2$ is required in the annealing surface (exposure surface). However, in the embodiment, the high output and high light density in the multi-beam can be easily achieved by increasing the number of fibers arrayed and the number of laser beams multiplexed. For example, when the fiber output of one multiplex laser light source is set to 180 mW, the high output of 100 W can be stably obtained by bundling the 556 multiplex laser light sources. Additionally, the quality of the laser beam is stabilized and high power density. Accordingly, the laser annealing apparatus of the invention can correspond to the increase in deposition area of the low-temperature polysilicon, and to high throughput, in the future.

2. The outgoing end unit of the optical fiber can be attached exchangeably by using the connector or the like, and the maintenance becomes easy.

3. Since the multiplex module in which the small semiconductor lasers are multiplexed is small, the light source unit can be miniaturized, compared with the excimer laser.

In the case where the clad diameter of the outgoing end of the optical fiber is formed so as to be smaller than the clad diameter of the incident end, the diameter of light-emission unit is further decreased, and the high luminance of the fiber array light source 300A can be achieved. Therefore, the laser annealing apparatus having the deeper focal depth can be realized. For example, even if the annealing is performed in super-fine resolution where the beam diameter is not more than 1 μm and the resolution is not more than 0.1 μm, the deep focal depth can be obtained, and high-speed and fine annealing can be performed.

It is also possible that, for example, a Nd:YAGSHG laser is used as the laser light source in the laser annealing apparatus.

It is also possible that the solid-state laser, in which a $Pr^{3+}$ doped solid laser crystal is utilized and the laser beam having the wavelength of 465 to 495 nm is oscillated, or the solid-state laser which oscillates the laser beam having a green region of the wavelength of 515 to 555 nm is used as the laser light source in the laser annealing apparatus.

It is possible that the solid laser crystal such as $Nd^{3+}$ doped YAG($Y_3Al_5O_2$), liYF$_4$, and YVO$_4$ is formed by the SHG (Second Harmonic Generation) solid-state laser which generates the SH beam (Second Harmonic) of a semiconductor laser excited Nd solid-state laser excited by the laser diode.

It is also possible that the laser beam having the wavelength of 488 nm or the laser beam having the wavelength of 514.5 nm in an Ar laser is used as the laser light source in the laser annealing apparatus. Further, it is also possible to use a multi-line Ar laser.

What is claimed is:

1. A laser annealing apparatus comprising:
a laser light source, which emits a laser beam;
an optical unit which forms an optical path along which the laser beam is transmitted through a subject to be annealed;
a first mirror, which reflects the laser beam that has been transmitted through the subject so that a direction of the laser beam is reversed along the optical path along which the laser beam is transmitted through the subject, to irradiate the subject; and
wherein, after the laser beam is reversed by the first mirror, the optical unit reverses the laser beam transmitted through the subject from the first mirror back to irradiate the subject.

2. A laser annealing apparatus according to claim 1, wherein the optical unit includes a spatial light modulator.

3. A laser annealing apparatus according to claim 2, wherein the spatial light modulator is a digital micromirror device.

4. A laser annealing apparatus according to claim 1, wherein the subject to be annealed is amorphous silicon having a film thickness in a range of 25 to 230 nm, and the laser light source emits a light beam of a second harmonic wave of the laser beam by using a Nd solid-state laser as an oscillation source.

5. A laser annealing apparatus according to claim 1, wherein the laser light source emits a light beam having a wavelength in a range of 400 nm to 460 nm by using a GaN semiconductor laser.

6. A laser annealing apparatus according to claim 1, wherein the laser light source is a fiber array light source.

7. A laser annealing apparatus according to claim 6, wherein the fiber array light source drives and controls each semiconductor laser beam.

8. A laser annealing apparatus according to claim 1, further comprising a second mirror, which reflects the laser beam transmitted through the subject from the first mirror so as to irradiate the subject.

9. A laser annealing apparatus according to claim 1, wherein the optical unit comprises a polarization beam splitter and a second mirror which reflects the laser beam which has been transmitted through the subject, has passed through a quarter-wave plate as polarized incident light, has been reflected by the first mirror, has passed through the quarter-wave plate again to become polarized light orthogonal to the polarized incident light, has been transmitted through the subject and has been reflected by the polarization beam splitter, so that a direction of the laser beam is reversed along the optical path along which the laser beam is transmitted through the subject, and
wherein the polarization beam splitter transmits the laser beam from the laser light source and the laser beam reversed by the second mirror.

10. A laser annealing apparatus comprising:
a laser light source, which emits a laser beam;
an optical unit which forms an optical path along which the laser beam is transmitted through a subject to be annealed;
a first mirror, which reflects the laser beam that has been transmitted through the subject so that a direction of the laser beam is reversed along the optical path along which the laser beam is transmitted through the subject, to irradiate the subject;
wherein, after the laser beam is reversed by the first mirror, a reflecting unit, which reflects the laser beam transmitted through the subject from the first mirror so as to irradiate the subject;
a polarization beam splitter, which is arranged on the optical path between the laser light source and the subject and transmits the laser beam emitted from the laser light source; and
a quarter-wave plate which is arranged on the optical path between the subject and the first mirror,
wherein the reflecting unit is a second mirror which reflects the laser beam which has been transmitted through the subject, has passed through the quarter-wave plate as polarized incident light, has been reflected by the first mirror, has passed through the quarter-wave plate again to become polarized light orthogonal to the polarized incident light, has been transmitted through the subject and has been reflected by the polarization beam splitter, so that a direction of the laser beam is reversed along the optical path along which the laser beam is transmitted through the subject.

11. A laser annealing system comprising:
a subject comprising film to be annealed and a reflecting film;
a laser light source which emits a laser beam; and
an optical unit which forms an optical path along which the laser beam is transmitted through the film to be annealed provided in the subject of an annealing process,
wherein the reflecting film reflects the laser beam that has been transmitted through the film to be annealed so that a direction of the laser beam is reversed along the optical path along which the laser beam is transmitted through the film to be annealed, and
wherein, after the laser beam is reversed by the reflecting film, the optical unit reverses the laser beam back to irradiate the subject.

12. A laser annealing according system to claim 11, further comprising:
a polarization beam splitter which is arranged on the optical path between the laser light source and the subject and transmits the laser beam emitted from the laser light source; and
a mirror which reflects the laser beam which has been transmitted through the film to be annealed, has passed through a buffer layer having a function of a quarter-wave plate as polarized incident light, has been reflected by the reflecting film, has passed through the buffer layer having the function of the quarter-wave plate again to become polarized light orthogonal to the polarized incident light, has been transmitted through the film to be annealed again, and has been reflected by the polarization beam splitter, so that a direction of the laser beam is reversed along the optical path along which the laser beam is transmitted through the subject.

13. A laser annealing according system to claim 11, wherein the optical unit includes a spatial light modulator.

14. A laser annealing according system to claim 13, wherein the spatial light modulator is a digital micromirror device.

15. A laser annealing according system to claim 11, wherein the subject to be annealed is amorphous silicon having a film thickness in a range of 25 to 230 nm, and the laser light source emits a light beam of a second harmonic wave of the laser beam by using a Nd solid-state laser as an oscillation source.

16. A laser annealing according system to claim 11, wherein the laser light source emits a light beam having a wavelength in a range of 400 nm to 460 nm by using a GaN semiconductor laser.

17. A laser annealing system according to claim 11, wherein the laser light source is a fiber array light source.

18. A laser annealing system according to claim 17, wherein the fiber array light source drives and controls each semiconductor laser beam.

19. The system according to claim 11, wherein the optical unit comprises a reflecting component that reverses a direction of the laser beam back to irradiate the subject after the reflecting film reversed the direction of the laser beam.

20. The system according to claim 11, wherein the optical unit and the reflecting film reverse a direction of the laser beam so that the laser beam irradiate the subject more than twice.

21. A laser annealing apparatus comprising:
a laser light source which emits a laser beam; and
an optical unit which forms an optical path along which the laser beam is transmitted through a film to be annealed provided in a subject of an annealing process;
a polarization beam splitter which is arranged on the optical path between the laser light source and the subject and transmits the laser beam emitted from the laser light source; and
a mirror, which reflects the laser beam which has been transmitted through the film to be annealed, has passed through a buffer layer having a function of a quarter-wave plate as polarized incident light, has been reflected by a reflecting film, has passed through the buffer layer having the function of the quarter-wave plate again to become polarized light orthogonal to the polarized incident light, has been transmitted through the film to be annealed again, and has been reflected by the polarization beam splitter, so that a direction of the laser beam is reversed along the optical path along which the laser beam is transmitted through the subject.

22. A laser annealing apparatus comprising:
a laser light source, which emits a laser beam;
an optical unit which forms an optical path along which the laser beam is transmitted through a subject to be annealed;
a first reflection component, which reflects the laser beam that has been transmitted through the subject so that a direction of the laser beam is reversed along the optical path to irradiate the subject; and
a second reflection component, which reflects the laser beam transmitted through the subject from the first reflection component, so that a direction of the laser beam is reversed along the optical path to irradiate the subject.

23. The apparatus according to claim 22, wherein at least one of the first reflection component and the second reflection component reflect the light beam emitted by the laser light source more than once.

24. The apparatus according to claim 22, wherein the first reflection component and the second reflection component comprise at least one of a reflective film, a mirror, and a micro-mirror.

* * * * *